United States Patent [19]
Karakida et al.

[11] Patent Number: 5,805,628
[45] Date of Patent: Sep. 8, 1998

[54] SEMICONDUCTOR LASER

[75] Inventors: Shoichi Karakida; Norio Hayafuji; Tatsuya Kimura; Motoharu Miyashita; Hirotaka Kizuki; Takashi Nishimura, all of Tokyo, Japan

[73] Assignee: Mitsubishi Denki Kabushiki Kaisha, Tokyo, Japan

[21] Appl. No.: 735,637

[22] Filed: Oct. 23, 1996

[30] Foreign Application Priority Data

Jun. 19, 1996 [JP] Japan ................................. 8-157875

[51] Int. Cl.⁶ ........................................................ H01S 3/19
[52] U.S. Cl. ............................................. 372/46; 372/48
[58] Field of Search .................................. 372/48, 46, 50

[56] References Cited

U.S. PATENT DOCUMENTS

| 4,630,279 | 12/1986 | Kajimura et al. | 372/48 |
| 4,792,960 | 12/1988 | Yamamoto | 372/48 |
| 4,815,084 | 3/1989 | Scifres et al. | 372/50 |
| 5,070,510 | 12/1991 | Konushi et al. | 372/46 |
| 5,390,205 | 2/1995 | Mori et al. | 372/46 |
| 5,428,227 | 6/1995 | Satoh | 372/50 |
| 5,661,743 | 8/1997 | Nagai | 372/46 |

FOREIGN PATENT DOCUMENTS

| 555692 | 3/1993 | Japan . |
| 750815 | 5/1995 | Japan . |

OTHER PUBLICATIONS

Soda et al., "Tapered Thickness Waveguide Integrated BH MQW Lasers", Extended Abstracts of the 1995 International Conference on Solid State Devices and Materials, Osaka, Japan 1995, pp. 425–427.

Primary Examiner—Rodney B. Bovernick
Assistant Examiner—Yisun Song
Attorney, Agent, or Firm—Leydig, Voit & Mayer, Ltd.

[57] ABSTRACT

A semiconductor laser device includes a semiconductor substrate of a first conductivity type; opposed light emitting facets; a double heterojunction structure disposed on the semiconductor substrate and including an optical waveguide that extends between the facets and comprises a light emitting region and a lens region, the lens region being between the light emitting region and one of the facets, the double heterojunction structure including a plurality of AlGaAs series compound semiconductor layers which are thicker in the light emitting region than in the lens region; and a current blocking structure disposed on both sides of the double heterojunction structure and including a lower AlGaAs series compound semiconductor layer of the first conductivity type, an intermediate AlGaAs series compound semiconductor layer of a second conductivity type, opposite the first conductivity type, and an upper AlGaAs series compound semiconductor layer of the first conductivity type. Therefore, a reactive current that does not contribute to laser oscillation is prevented from flowing through the current blocking structure.

11 Claims, 18 Drawing Sheets

Fig.6 (a)
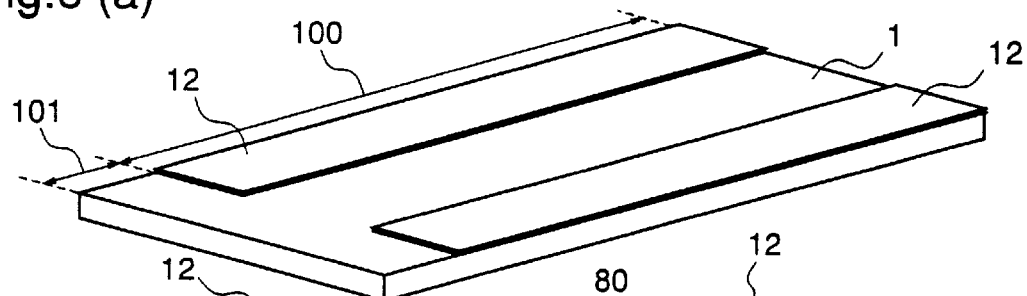
Fig.6 (b)
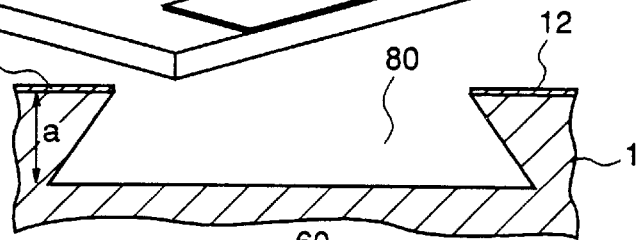
Fig.6 (c)
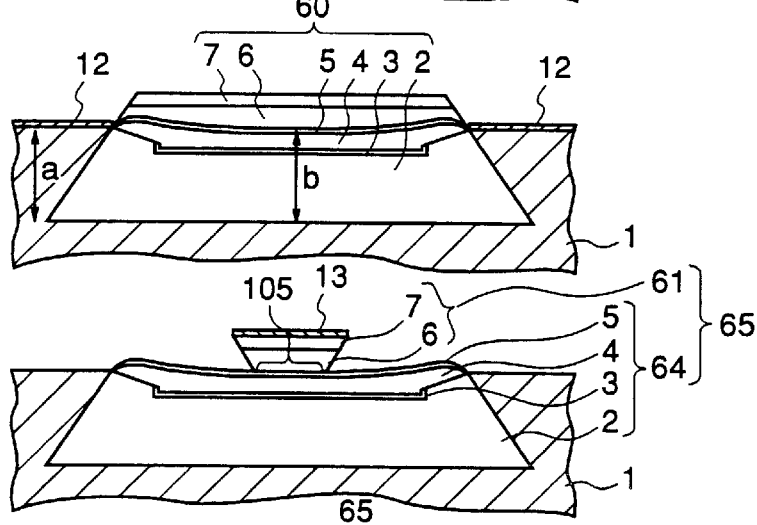
Fig.6 (d)
Fig.6 (e)
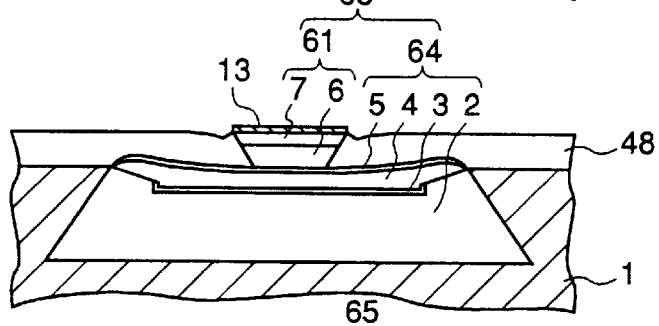
Fig.6 (f)
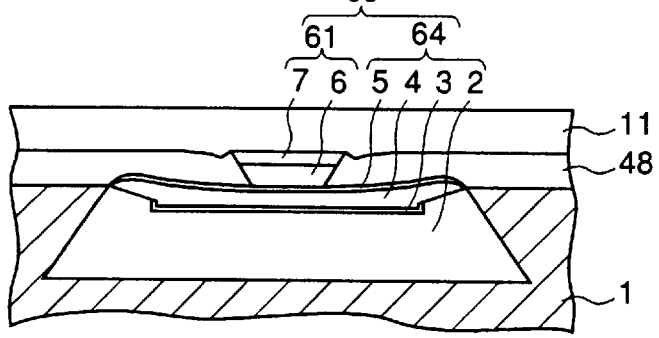

Fig.9 (a)
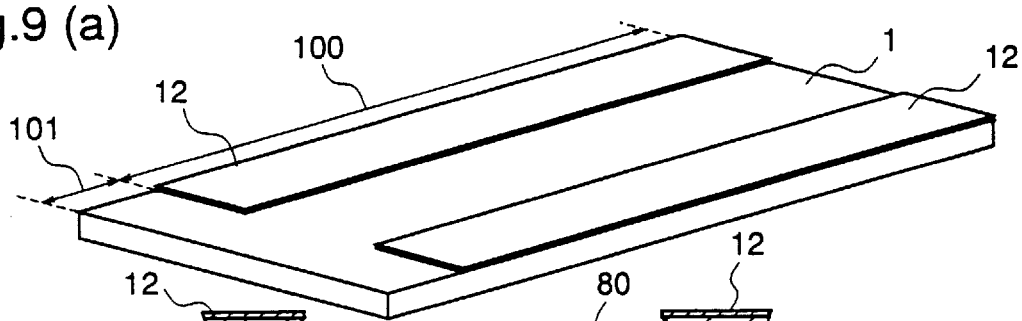
Fig.9 (b)
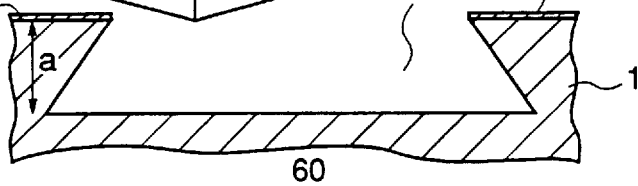
Fig.9 (c)
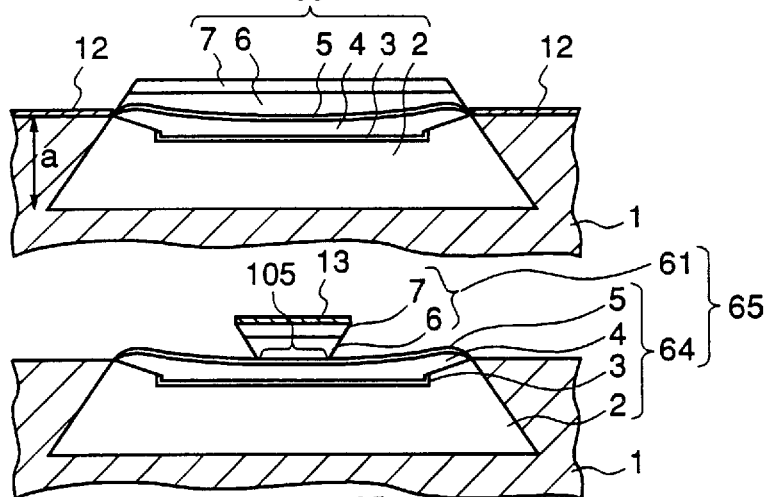
Fig.9 (d)
Fig.9 (e)
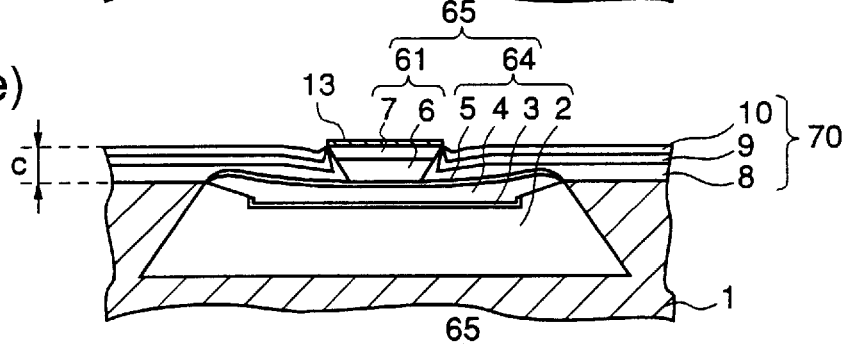
Fig.9 (f)
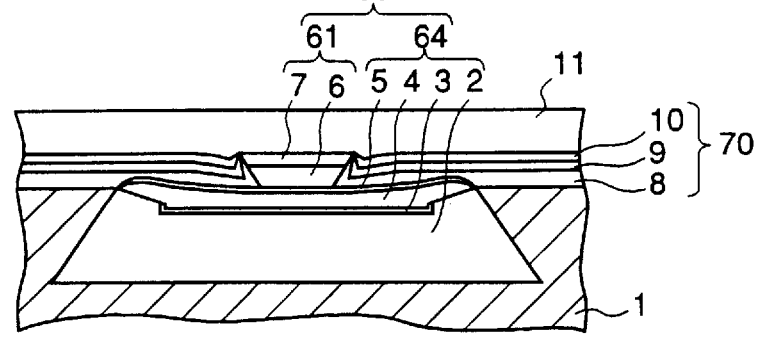

SEMICONDUCTOR LASER

FIELD OF THE INVENTION

The present invention relates to a semiconductor laser device comprising AlGaAs and related compound semiconductors and having a waveguide lens, and a method of fabricating the semiconductor laser device.

BACKGROUND OF THE INVENTION

FIGS. 17(a)–17(f) are perspective views illustrating process steps in a method of fabricating a conventional semiconductor laser device comprising InP and related compound semiconductors and having a waveguide lens.

Initially, as illustrated in FIG. 17(a), a pair of thin dielectric films 32, such as $SiO_2$, are formed on an n type InP substrate 21, sandwiching a region 100 where an optical waveguide that emits laser light (hereinafter referred to as a waveguide light emitting region) will be later fabricated.

In the step of FIG. 17(b), using the dielectric films 32 as masks, an n type InP lower cladding layer 22, an undoped InGaAsP/InGaAs multiquantum well active layer 23, and a p type InP upper cladding layer 24 are selectively grown on a region of the substrate 21 where the dielectric films 32 are not present, thereby producing a double heterojunction structure 60. Since the masks 32 are not present in a region 101 transverse to and continuous with the waveguide light emitting region 100, where a waveguide lens will be later produced, the double heterojunction structure is grown over this region 101.

In the step of FIG. 17(c), a stripe-shaped dielectric film 33, such as $SiO_2$, is formed on a region of the p type InP upper cladding layer 24 where a waveguide is later produced. Thereafter, as shown in FIG. 17(d), using the dielectric film 33 as a mask, the p type InP upper cladding layer 24, the active layer 23, and an upper portion of the n type InP lower cladding layer 22 are etched with an HBr-based etchant, forming a waveguide mesa comprising the double heterojunction structure 60.

In the step of FIG. 17(e), using the dielectric film 33 as a mask, a p type InP current blocking layer 25, an n type InP current blocking layer 28, and a p type InP current blocking layer 26 are successively grown by MOCVD (Metal Organic Chemical Vapor Deposition), contacting both sides of the waveguide mesa. After removal of the mask 33, a p type InGaAsP contact layer 27 is grown over the entire surface. Finally, a p side electrode 14 and an n side electrode 15 are fabricated on the contact layer 27 and the substrate 21, respectively, to complete a semiconductor laser device with a waveguide lens as shown in FIG. 17(f).

When InP series semiconductor materials are grown by, for example, MOCVD, on a semiconductor substrate partially masked with dielectric films as shown in FIG. 17(b), grown semiconductor layers are thicker in a central region sandwiched by the dielectric films (waveguide light emitting region 100 in FIG. 17(b)) than in a region not sandwiched by the dielectric films (waveguide lens region 101 in FIG. 17(b)). This result is attributed to the growth mechanism described below.

When an organometallic compound containing a group III element, such as TEG (triethylgallium) or TMI (trimethylindium), is applied to the surface of the semiconductor substrate, it is thermally decomposed to produce group III atoms. The group III atoms are taken into appropriate positions of the crystal lattice of the semiconductor substrate. Meanwhile, group V atoms are produced by thermal decomposition of $AsH_3$ (arsine) or $PH_3$ (phsphine) that is excessively applied to the surface of the substrate. The group III atoms and the group V atoms combine with each other, whereby a crystalline layer is grown on the semiconductor substrate. On the other hand, the organometallic compound containing the group III element applied to the dielectric mask is not thermally decomposed but moves on the surface of the dielectric mask. This phenomenon is called migration. The group III element is taken into the crystal surface in the vicinity of the dielectric mask and combines with the group V atoms as mentioned above. Because of the migration effect, the incorporation of the group III element is higher on the semiconductor surface in the vicinity of the dielectric mask than on the semiconductor surface remote from the dielectric mask, so that the crystal growth rate in the vicinity of the dielectric mask is increased. Therefore, in the double heterojunction structure 60 shown in FIG. 17(b), because of the migration of group III atoms from the dielectric masks 32, the semiconductor layers 22, 23, and 24 are thicker in the waveguide light emitting region 100 than in the waveguide lens region 101.

A description is given of the operation of the semiconductor laser device with a waveguide lens.

When a forward bias voltage is applied across the p side electrode 14 and the n side electrode 15, electrons and holes are injected into the active layer 23 and recombine to produce light. When the current flowing between the electrodes exceeds a threshold current level, laser oscillation occurs. Since the thicknesses of the respective layers included in the double heterojunction structure 60 are thinner in the waveguide lens region 101 adjacent to the front facet than in the waveguide light emitting region 100, the spot size of laser light sufficiently increases in the waveguide lens region 101. Therefore, after the laser light is emitted from the front facet of the laser, the spot size of the laser light hardly increases, and the laser light travels straight in the air. In this semiconductor laser device, since the double heterojunction structure 60 in the waveguide lens region 101 serves as an ordinary optical lens, it is possible to narrow laser light without an external optical lens or the like. When this semiconductor laser device with a waveguide lens is used in optical communication system, laser light emitted from the laser device is guided into an optical fiber with high efficiency using the laser device alone, resulting in a reduction in cost.

A description is given of the mechanism of the waveguide lens region 101 that increases the spot size of laser light emitted from the waveguide light emitting region 100. Although a greater part of the laser light is usually confined in the active layer in the double heterojunction structure, some light escapes from the active layer into the upper and lower cladding layers as the active layer becomes thinner. For example, according to a calculation on a 0.78 $\mu$m band AlGaAs series laser, when an active layer is 0.5 $\mu$m thick, 95% of laser light is confined in the active layer. However, when the active layer is 0.05 $\mu$m thick, only 13% of laser light is confined in the active layer. In the semiconductor laser device with a waveguide lens, laser light travels through the waveguide light emitting region 100 and the waveguide lens region 101 and is emitted from the front facet of the laser. Since the active layer is thinner in the waveguide lens region 101 than in the waveguide light emitting region 100, the spot size of the laser light increases in the waveguide lens. It is known that, when the spot size of laser light increases in a semiconductor laser, the spot size is reduced after the laser light is emitted from the laser. To the contrary, when the spot size of laser light is reduced in the semiconductor laser, the spot size increases after the laser light is emitted from the laser. Therefore, the spot size of laser light that has increased in the waveguide lens region 101 does not increase after the laser light is emitted from the facet, and the laser light travels straight in the air. In this way, the double heterojunction structure 60 in the waveguide lens region 101 serves as an optical lens.

In the foregoing description, emphasis has been placed upon an InP series semiconductor laser device with a waveguide lens. However, an AlGaAs series semiconductor laser device with a waveguide lens, which is usually employed in an information processing system, offers similar operation and effect. Since an AlGaAs series semiconductor laser device employs easily oxidizable AlGaAs for an active layer and cladding layers, special consideration must be paid to the fabrication process.

FIGS. 18(a)–18(g) are a perspective view (18(a)) and cross-sectional views (18(b)–18(g)) illustrating process steps in a method of fabricating an AlGaAs series semiconductor laser device with a waveguide lens.

Initially, as illustrated in FIG. 18(a), a pair of thin dielectric films 12, such as $SiO_2$, are formed on an n type GaAs substrate 1, sandwiching a waveguide light emitting region 100. Thereafter, as illustrated in FIG. 18(b), using the dielectric films 12 as masks, there are successively grown on the surface of the GaAs substrate 1, an n type $Al_xGa_{1-x}As$ (x=0.48) lower cladding layer 2, a multiquantum well active layer 3 comprising, alternatingly laminated, undoped $Al_xGa_{1-x}As$ (x=0.10) well layers and undoped $Al_xGa_{1-x}As$ (x=0.35) barrier layers, a p type $Al_xGa_{1-x}As$ (x=0.48) first upper cladding layer 4, a p type $Al_xGa_{1-x}As$ (x=0.70) etch stopping layer 5, a p type $Al_xGa_{1-x}As$ (x=0.48) second upper cladding layer 6, and a p type GaAs cap layer 7, thereby producing a double heterojunction structure 60.

In the step of FIG. 18(c), a thin dielectric film 13, such as $SiO_2$, is formed on the cap layer 7. Using the dielectric film 13 as a mask, the p type GaAs cap layer 7 and the p type $Al_xGa_{1-x}As$ (x=0.48) second upper cladding layer 6 are etched with an etchant that selectively etches AlGaAs having an Al composition x smaller than 0.7, until the surface of the etch stopping layer 5 is exposed, producing a mesa structure 61 under the mask 13 opposite a region where a current is injected (hereinafter referred to as a current injection region 105). As a result, a double heterojunction structure 63 comprising a lower part 62 that comprises the lower cladding layer 2, the active layer 3, the first upper cladding layer 4, and the etch stopping layer 5, and an upper part, i.e., the mesa structure, 61 that comprises the second upper cladding layer 6 and the cap layer 7, is obtained (FIG. 18(d)). In this double heterojunction structure 63, a portion of the active layer 3 opposite the mesa structure 61 and the vicinity serve as a waveguide.

In the step of FIG. 18(e), after removal of the mask 12, an n type GaAs current blocking layer 48 for concentrating current in a light emitting region with high efficiency is grown on the lower part 62 of the double heterojunction structure 63 at both sides of the mesa structure 61, and on the surface of the substrate 1 at both sides of the lower part 62. Thereafter, as illustrated in FIG. 18(f), the mask 13 is removed and a p type GaAs contact layer 11 is grown over the entire surface. Finally, as illustrated in FIG. 18(g), a p side electrode 14 and an n side electrode 15 are produced to complete an AlGaAs series semiconductor laser device having a waveguide lens.

According to the method of fabricating an AlGaAs series semiconductor laser device mentioned above, in the step of producing the double heterojunction structure 63 shown in FIG. 18(d), the active layer 3 and the lower cladding layer 2 are not etched to prevent both sides of a laser light emitting region in the active layer from being oxidized.

Generally, AlGaAs and related compound semiconductors are easily oxidized when exposed to the air as compared with InP and related compound semiconductors, and a non-radiative recombination center that absorbs laser light is produced in the oxidized part. In the completed semiconductor laser device shown in FIG. 18(g), current flows and laser light is produced in the active layer 3 opposite the mesa structure 61. In the process step shown in FIG. 18(d), this region is shown as a laser light producing region 106 in the active layer 3 opposite the current injection region 105. In the step of FIG. 18(d), if the double heterojunction structure is etched to reach the lower cladding layer 2 as in the process step of forming a waveguide of an InP semiconductor laser device shown in FIG. 17(d), both sides of the laser light producing region 106 in the active layer 3 are unfavorably exposed to the air and oxidized. As a result, a non-radiative recombination center is produced, and the laser characteristics are deteriorated. In order to prevent the laser light producing region 106 in the active layer 3 from being oxidized, in the step of FIG. 18(d), after formation of the mask 13, only the cap layer 7 and the second upper cladding layer 6 are selectively etched using the etch stopping layer 5 so that the active layer 3 is not etched. Thereby, unwanted degradation of laser characteristics is avoided.

In the AlGaAs series semiconductor laser device shown in FIG. 18(g), the n type GaAs current blocking layer 48 and the p type GaAs contact layer 11 are disposed in this order on the surface of the n type GaAs substrate 1 at both sides of the lower part 62 of the double heterojunction structure 63. Since the substrate 1, the current blocking layer 48, and the contact layer 11 comprise GaAs, no heterojunction is produced, so that the built-in potential at both sides of the double heterojunction structure 63 is lower than the built-in potential in the double heterojunction structure 63. Therefore, when a current flows in the semiconductor laser, the current does not flow in a region of the active layer 3 opposite the current injected mesa structure 61 but flows in regions where the n type GaAs current blocking layer 48 and the p type GaAs contact layer 11 are disposed on the n type GaAs substrate 1 at both sides of the double heterojunction structure 63, i.e., reactive current 50 flows. As a result, the threshold current is significantly increased and, in the worst case, no laser oscillation occurs.

Furthermore, in the method of fabricating an AlGaAs series semiconductor laser device with a waveguide lens shown in FIGS. 18(a)–18(g), since the double heterojunction structure 63 has the upper part 61 and the lower part 62 to prevent the laser light producing region 106 in the active layer 3 from being exposed to the air (FIG. 18(d)), when the double heterojunction structure 63 is buried in the current blocking layer 48 (FIG. 18(e)), the surface of the current blocking layer 48 cannot be planar, resulting in a semiconductor laser device with poor planarity that makes the subsequent processing, such as wire-bonding or junction down assembling, difficult.

SUMMARY OF THE INVENTION

An object of the present invention is to provide an AlGaAs series semiconductor laser device with a waveguide lens, that reduces reactive current and has a planar surface.

Another object of the present invention is to provide a relatively simple method for fabricating the semiconductor laser device.

Other objects and advantages of the invention will become apparent from the detailed description that follows.

The detailed description and specific embodiments described are provided only for illustration since various additions and modifications within the scope of the invention will be apparent to those of skill in the art from the detailed description.

According to a first aspect of the present invention, a semiconductor laser device comprises a semiconductor substrate of a first conductivity type; opposed light emitting facets; a double heterojunction structure disposed on the semiconductor substrate and including an optical waveguide that extends between the facets and comprises a light emitting region and a lens region between the light emitting region and one of the facets, the double heterojunction structure comprising a plurality of AlGaAs series compound semiconductor layers which are thicker in the light emitting region than in the lens region; and a current blocking structure disposed on both sides of the double heterojunction structure and comprising a lower AlGaAs series compound semiconductor layer of the first conductivity type, an intermediate AlGaAs series compound semiconductor layer of a second conductivity type, opposite the first conductivity type, and an upper AlGaAs series compound semiconductor layer of the first conductivity type.

Therefore, a reactive current that does not contribute to laser oscillation is prevented from flowing through the current blocking structure.

According to a second aspect of the present invention, in the above-mentioned semiconductor laser device, the double heterojunction structure comprises a lower part comprising a lower cladding layer of the first conductivity type, an active layer, and a first upper cladding layer of the second conductivity type, and an upper part located opposite a current injection region on the lower part and including a second upper cladding layer of the second conductivity type; and the current blocking structure is disposed on the lower part of the double heterojunction structure at both sides of the upper part of the double heterojunction structure and on the semiconductor substrate at both sides of the lower part of the double heterojunction structure. Therefore, a reactive current that does not contribute to laser oscillation is prevented from flowing through the current blocking structure.

According to a third aspect of the present invention, a semiconductor laser device comprises a semiconductor substrate of a first conductivity type having a groove at a surface; opposed light emitting facets; a double heterojunction structure including an optical waveguide that extends between the facets and comprises a light emitting region and a lens region between the light emitting region and one of the facets, the double heterojunction structure comprising a plurality of AlGaAs series compound semiconductor layers which are thicker in the light emitting region than in the lens region, and a part of the double heterojunction structure being buried in the groove at the surface of the substrate; and a current blocking structure disposed on both sides of the double heterojunction structure and comprising AlGaAs series compound semiconductors. Therefore, the planality of the semiconductor laser device is improved.

According to a fourth aspect of the present invention, in the above-mentioned semiconductor laser device, the double heterojunction structure comprises a lower part comprising a lower cladding layer of the first conductivity type, an active layer, and a first upper cladding layer of the second conductivity type, and an upper part narrower than the lower part, located on the lower part, and including a second upper cladding layer of the second conductivity type; the current blocking structure is disposed on the lower part of the double heterojunction structure at both sides of the upper part of the double heterojunction structure and on the semiconductor substrate outside the groove; and the groove at the surface of the substrate has a depth a and the lower part of the double heterojunction structure has a thickness b, and the depth a and the thickness b satisfy a relationship, $0 \leq a \leq b$. Therefore, the planality of the semiconductor laser is improved.

According to a fifth aspect of the present invention, in the above-mentioned semiconductor laser device, the semiconductor substrate comprises an n type semiconductor; the lower part of the double heterojunction structure comprises an n type AlGaAs lower cladding layer, an active layer, a p type AlGaAs first upper cladding layer, and a p type AlGaAs etch stopping layer having an Al composition ratio, and the upper part of the double heterojunction structure is disposed opposite a current injection region on the lower part and comprises p type AlGaAs second upper cladding layer having an Al composition ratio smaller than the Al composition ratio of the etch stopping layer, and a p type GaAs cap layer; the current blocking structure comprises an n type lower layer, a p type intermediate layer, and an n type upper layer successively disposed on the lower part of the double heterojunction structure at both sides of the upper part of the double heterojunction structure; and the depth of the groove at the surface of the substrate is larger than the thickness of the lower part of the double heterojunction structure, and the thickness of the current blocking structure is larger than the thickness of the upper part of the double heterojunction structure. Therefore, the planality of the semiconductor laser device is improved, and a reactive current that does not contribute to laser oscillation is prevented from flowing through the current blocking structure.

According to a sixth aspect of the present invention, the above-mentioned semiconductor laser device includes a coating layer comprising a semiconductor of the second conductivity type and disposed on the surface of the semiconductor substrate where the groove is not present. Therefore, with a simple current blocking structure comprising a single semiconductor layer of the first conductivity type, a reactive current that does not contribute to laser oscillation is prevented from flowing through the current blocking structure.

According to a seventh aspect of the present invention, a semiconductor laser device comprises a semiconductor substrate of a first conductivity type having a groove at a surface; opposed light emitting facets; a double heterojunction structure including an optical waveguide that extends between the facets and comprises a light emitting region and a lens region between the light emitting region and one of the facets, the double heterojunction structure comprising a plurality of AlGaAs series compound semiconductor layers, at least a lower cladding layer of the first conductivity type, an active layer, and a first upper cladding layer of a second conductivity type, opposite the first conductivity type, which are disposed within the groove at the surface of the substrate and are thicker in the light emitting region than in the lens region; a coating layer comprising a semiconductor of the second conductivity type and disposed on the surface of the substrate where the groove is not present; current blocking layers comprising an AlGaAs series semiconductor material and disposed on the double heterojunction structure except a portion opposite a current injection region, and on the coating layer; and a second upper cladding layer of the second conductivity type disposed on the portion of the double heterojunction structure opposite the current injection region and on the current blocking layers. Therefore, the planality of the semiconductor laser device is improved. Further, with a simple current blocking structure comprising a single semiconductor layer of the first conductivity type, a reactive current that does not contribute to laser oscillation is prevented from flowing through the current blocking structure.

According to an eighth aspect of the present invention, a method of fabricating a semiconductor laser device comprises preparing a semiconductor substrate of a first conductivity type having opposed front and rear surfaces; forming spaced apart first dielectric films on the front surface of the semiconductor substrate, defining a first region between the first dielectric films where a light emitting portion of an optical waveguide is later fabricated, and a second region transverse to and continuous with the first region and contiguous to what becomes a light emitting facet of the laser, where a lens portion of the optical waveguide is later fabricated; using the first dielectric films as masks, growing a plurality of AlGaAs series compound semiconductor layers on the surface of the semiconductor substrate to produce a double heterojunction structure in which the compound semiconductor layers are thicker in the first region than in the second region; forming a second dielectric film on the double heterojunction structure opposite a stripe-shaped current injection region having a width narrower than the space between the first dielectric films; using the first dielectric films and the second dielectric film as masks, etching the double heterojunction structure to a prescribed depth to form a mesa opposite the second dielectric film and a surface at both sides of the mesa, thereby forming an upper part of the double heterojunction structure comprising the mesa and a lower part of the double heterojunction structure beneath the mesa and the surface at both sides of the mesa; removing the first dielectric films; using the second dielectric film as a mask, successively growing a lower AlGaAs series compound semiconductor layer of the first conductivity type, an intermediate AlGaAs series compound semiconductor layer of a second conductivity type, opposite the first conductivity type, and an upper AlGaAs series compound semiconductor layer of the first conductivity type on the surface of the lower part of the double heterojunction structure at both sides of the upper part of the double heterojunction structure and on the surface of the substrate at both sides of the lower part of the double heterojunction structure; removing the second dielectric film; growing an AlGaAs series compound semiconductor contact layer of the second conductivity type over the entire surface; and forming a surface electrode and a rear electrode on the contact layer and the rear surface of the substrate, respectively. Therefore, a high efficiency semiconductor laser device with a waveguide lens, which can prevent a reactive current that does not contribute to laser oscillation from flowing through the current blocking structure, is produced in a relatively simple process.

According to a ninth aspect of the present invention, in the above-mentioned method, the semiconductor substrate comprises an n type semiconductor, the double heterojunction structure is prepared by successively growing an n type AlGaAs lower cladding layer, an active layer, a p type AlGaAs first upper cladding layer, a p type AlGaAs etch stopping layer having an Al composition ratio, a p type AlGaAs second upper cladding layer having an Al composition ratio smaller than the Al composition ratio of the etch stopping layer, and a p type GaAs cap layer on the surface of the semiconductor substrate, and the p type GaAs cap layer and the p type AlGaAs second upper cladding layer are etched using the second dielectric film as a mask until the etch stopping layer is exposed, thereby producing the upper part of the double heterojunction structure comprising portions of the cap layer and the second upper cladding layer under the second dielectric film, and the lower part of the double heterojunction structure comprising the lower cladding layer, the active layer, the first upper cladding layer, and the etch stopping layer. Therefore, a high efficiency semiconductor laser device with a waveguide lens, which can prevent a reactive current that does not contribute to laser oscillation from flowing through the current blocking structure, is produced in a relatively simple process.

According to a tenth aspect of the present invention, a method of fabricating a semiconductor laser device comprises preparing a semiconductor substrate of a first conductivity type having opposed front and rear surfaces; forming spaced apart first dielectric films on the front surface of the semiconductor substrate, defining a first region between the first dielectric films where a light emitting portion of an optical waveguide is later fabricated, and a second region transverse to and continuous with the first region and contiguous to what becomes a light emitting facet of the laser, where a lens portion of the optical waveguide is later fabricated; using the first dielectric films as masks, etching the semiconductor substrate to form a groove at the surface of the semiconductor substrate; using the first dielectric films as masks, growing a plurality of AlGaAs series compound semiconductor layers in the groove at the surface of the semiconductor substrate to produce a double heterojunction structure in which the compound semiconductor layers are thicker in the first region than in the second region; forming a second dielectric film on the double heterojunction structure opposite a stripe-shaped current injection region having a width narrower than the space between the first dielectric films; using the first dielectric films and the second dielectric film as masks, etching the double heterojunction structure to a prescribed depth to form a mesa opposite the second dielectric film and a surface at both sides of the mesa, thereby forming an upper part of the double heterojunction structure comprising the mesa and a lower part of the double heterojunction structure beneath the mesa and the surface at both sides of the mesa; removing the first dielectric films; using the second dielectric film as a mask, growing a current blocking structure comprising AlGaAs series compound semiconductors on the surface of the lower part of the double heterojunction structure at both sides of the upper part of the double heterojunction structure and on the surface of the substrate where the groove is not present; removing the second dielectric film; growing an AlGaAs series compound semiconductor contact layer of the second conductivity type over the entire surface; and forming a surface electrode and a rear electrode on the contact layer and the rear surface of the substrate, respectively. Therefore, a high efficiency semiconductor laser device with a waveguide lens, which can prevent a reactive current that does not contribute to laser oscillation from flowing through the current blocking structure, is produced in a relatively simple process.

According to an eleventh aspect of the present invention, in the above-mentioned method, the groove is formed at a depth a ($0 \leq a$) from the surface of the substrate; the double heterojunction structure is prepared by growing a lower cladding layer of the first conductivity type, an active layer, and a first upper cladding layer of the second conductivity type in the groove so that the total thickness b of these layers satisfies $a \leq b$ and, subsequently, growing an upper cladding layer of the second conductivity type on the first upper cladding layer, using the first dielectric films as masks; the second upper cladding layer is etched using the second dielectric film as a mask, thereby producing the upper part of the double heterojunction structure comprising a portion of the second upper cladding layer under the second dielectric film, and the lower part of the double heterojunction structure comprising the lower cladding layer, the active layer, and the first upper cladding layer; and the current blocking structure is prepared by growing a lower AlGaAs series compound semiconductor layer of the first conductivity type, an intermediate AlGaAs series compound semiconductor layer of the second conductivity type, and an upper AlGaAs series compound semiconductor layer of the first conductivity type on the lower part of the double heterojunction structure at both sides of the upper part of the heterojunction structure and on the surface of the substrate where the groove is not present. Therefore, a high efficiency semiconductor laser device with a waveguide lens, which has a planar surface and prevents a reactive current that does not contribute to laser oscillation from flowing through the current blocking structure, is produced in a relatively simple process.

According to a twelfth aspect of the present invention, in the above-mentioned method, the semiconductor substrate comprises an n type semiconductor; the double heterojunction structure is prepared by growing an n type AlGaAs lower cladding layer, an active layer, a p type AlGaAs first upper cladding layer, and a p type AlGaAs etch stopping layer having an Al composition ratio in the groove at the surface of the substrate so that the total thickness of these layers is larger than the depth of the groove and, subsequently, growing a p type AlGaAs second upper cladding layer having an Al composition ratio smaller than the Al composition ratio of the etch stopping layer, and a p type GaAs cap layer on the etch stopping layer; the p type GaAs cap layer and the p type AlGaAs second upper cladding layer are etched using the second dielectric film as a mask until the etch stopping layer is exposed, thereby producing the upper part of the double heterojunction structure comprising portions of the cap layer and the second upper cladding layer under the second dielectric film, and the lower part of the double heterojunction structure comprising the lower cladding layer, the active layer, the first upper cladding layer, and the etch stopping layer; and the current blocking structure is prepared by growing an n type lower AlGaAs series compound semiconductor layer, a p type intermediate AlGaAs series compound semiconductor layer, and an n type upper AlGaAs series compound semiconductor layer on the lower part of the double heterojunction structure at both sides of the upper part of the heterojunction structure and on the surface of the substrate where the groove is not present so that the total thickness of these layers is larger than the thickness of the upper part of the double heterojunction structure. Therefore, a high efficiency semiconductor laser device with a waveguide lens, which has a planar surface and prevents a reactive current that does not contribute to laser oscillation from flowing through the current blocking structure, is produced in a relatively simple process.

According to a thirteenth aspect of the present invention, in the above-mentioned method, before formation of the first dielectric films, a coating layer comprising a semiconductor of the second conductivity type is formed on the surface of the semiconductor substrate; the first dielectric films are formed on the coating layer; and the coating layer and the semiconductor substrate are etched using the first dielectric films as masks to form the groove. Therefore, with a simple current blocking structure comprising a single semiconductor layer of the first conductivity type, a reactive current that does not contribute to laser oscillation is prevented from flowing through the current blocking structure. Further, a planar semiconductor laser device with a waveguide lens is produced in a relatively simple process.

According to a fourteenth aspect of the present invention, a method of fabricating a semiconductor laser device comprises preparing a semiconductor substrate of a first conductivity type having opposed front and rear surfaces; forming a GaAs coating layer of a second conductivity type, opposite the first conductivity type, on the front surface of the semiconductor substrate; forming an AlGaAs protective layer having an Al composition ratio on the GaAs coating layer; forming spaced apart first dielectric films on the protective layer, defining a first region between the first dielectric films where a light emitting portion of an optical waveguide is later fabricated, and a second region transverse to and continuous with the first region and contiguous to what becomes a light emitting facet of the laser, where a lens portion of the optical waveguide is later fabricated; using the first dielectric films as masks, etching the protective layer, coating layer, and the semiconductor substrate to form a groove at the surface of the semiconductor substrate; using the first dielectric films as masks, growing an AlGaAs lower cladding layer of the first conductivity type, an active layer, an AlGaAs first upper cladding layer of the second conductivity type, and an AlGaAs etch stopping layer of the second conductivity type and having an Al composition ratio in the groove at the surface of the substrate and, subsequently, growing an AlGaAs second upper cladding layer of the second conductivity type and having an Al composition ratio smaller than the Al composition ratios of the protective layer and the etch stopping layer, and a GaAs cap layer of the second conductivity type on the etch stopping layer, thereby producing a double heterojunction structure in which these grown layers are thicker in the first region than in the second region; removing the first dielectric films; forming a second dielectric film on the double heterojunction structure opposite a stripe-shaped current injection region having a width narrower than the space between the first dielectric films; using the first dielectric films and the second dielectric film as masks, etching the p type GaAs cap layer and the p type AlGaAs second upper cladding layer until the etch stopping layer is exposed, thereby producing an upper part of the double heterojunction structure comprising portions of the cap layer and the second upper cladding layer under the second dielectric film, and a lower part of the double heterojunction structure comprising the lower cladding layer, the active layer, the first upper cladding layer, and the etch stopping layer; removing the protective layer; using the second dielectric film as a mask, growing a current blocking structure comprising AlGaAs series compound semiconductors on the lower part of the double heterojunction structure at both sides of the upper part of the double heterojunction structure and on the surface of the substrate where the groove is not present; removing the second dielectric film; growing an AlGaAs series compound semiconductor contact layer of the second conductivity type over the entire surface; and forming a surface electrode and a rear electrode on the contact layer and the rear surface of the substrate, respectively. Therefore, with a simple current blocking structure comprising a single semiconductor layer of the first conductivity type, a reactive current that does not contribute to laser oscillation is prevented from flowing through the current blocking structure. Further, a planar semiconductor laser device with a waveguide lens is produced in a relatively simple process.

According to a fifteenth aspect of the present invention, a method of fabricating a semiconductor laser device comprises preparing a semiconductor substrate of a first conductivity type having opposed front and rear surfaces; forming a coating layer comprising an AlGaAs series compound semiconductor of a second conductivity type, opposite the first conductivity type, on the surface of the semiconductor substrate; forming spaced apart first dielectric films on the protective layer, defining a first region between the first dielectric films where a light emitting portion of an optical waveguide is later fabricated, and a second region transverse to and continuous with the first region and contiguous to what becomes a light emitting facet of the laser, where a lens portion of the optical waveguide is later fabricated; using the first dielectric films as masks, etching the coating layer and the semiconductor substrate to form a groove at the surface of the semiconductor substrate; using the first dielectric films as masks, growing an AlGaAs lower cladding layer of the first conductivity type, an active layer, an AlGaAs first upper cladding layer of the second conductivity type, and an AlGaAs etch stopping layer of the second conductivity type and having an Al composition ratio in the groove at the surface of the substrate, thereby producing a double heterojunction structure in which these grown layers are thicker in the first region than in the second region; removing the first dielectric films; growing a current blocking layer comprising an AlGaAs series compound semiconductor material of the first conductivity type and having an Al composition ratio smaller than the Al composition ratio of the etch stopping layer over the entire surface; forming a second dielectric film on the double heterojunction structure except a current injection region; using the second dielectric film as a mask, etching the current blocking layer until the surface of the etch stopping layer is exposed to remove a portion of the current blocking layer opposite the current injection region; removing the second dielectric film; growing a second upper cladding layer comprising AlGaAs of the second conductivity type and a contact layer comprising an AlGaAs series compound semiconductor material of the second conductivity type over the entire surface; and forming a surface electrode and a rear electrode on the contact layer and the rear surface of the substrate, respectively. Therefore, with a simple current blocking structure comprising a single semiconductor layer of the first conductivity type, a reactive current that does not contribute to laser oscillation is prevented from flowing through the current blocking structure. Further, a planar semiconductor laser device with a waveguide lens is produced in a relatively simple process.

BRIEF DESCRIPTION OF THE DRAWINGS

FIG. 6(a) is a perspective view and FIGS. 6(b)–6(f) are cross-sectional views, illustrating process steps in a method of fabricating the semiconductor laser device shown in FIGS. 4 and 5.

FIG. 9(a) is a perspective view and FIGS. 9(b)–9(f) are cross-sectional views illustrating process steps in a method of fabricating the semiconductor laser device shown in FIGS. 7 and 8.

DETAILED DESCRIPTION OF THE PREFERRED EMBODIMENTS

[Embodiment 1]

Figure 1:
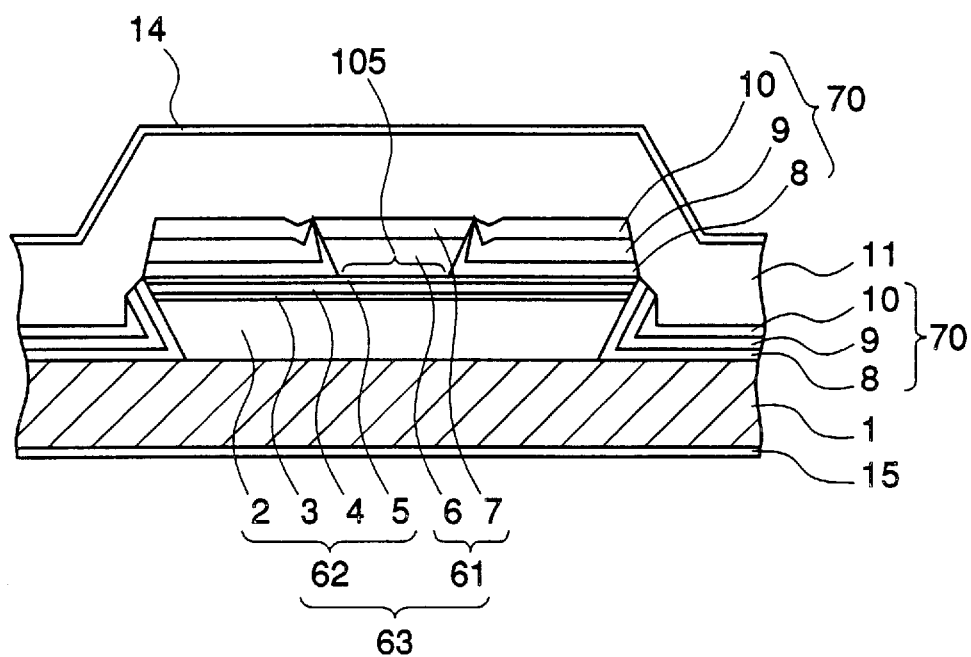
FIG. 1 is a cross-sectional view illustrating a semiconductor laser device with a waveguide lens in accordance with a first embodiment of the present invention.
Figure 2:
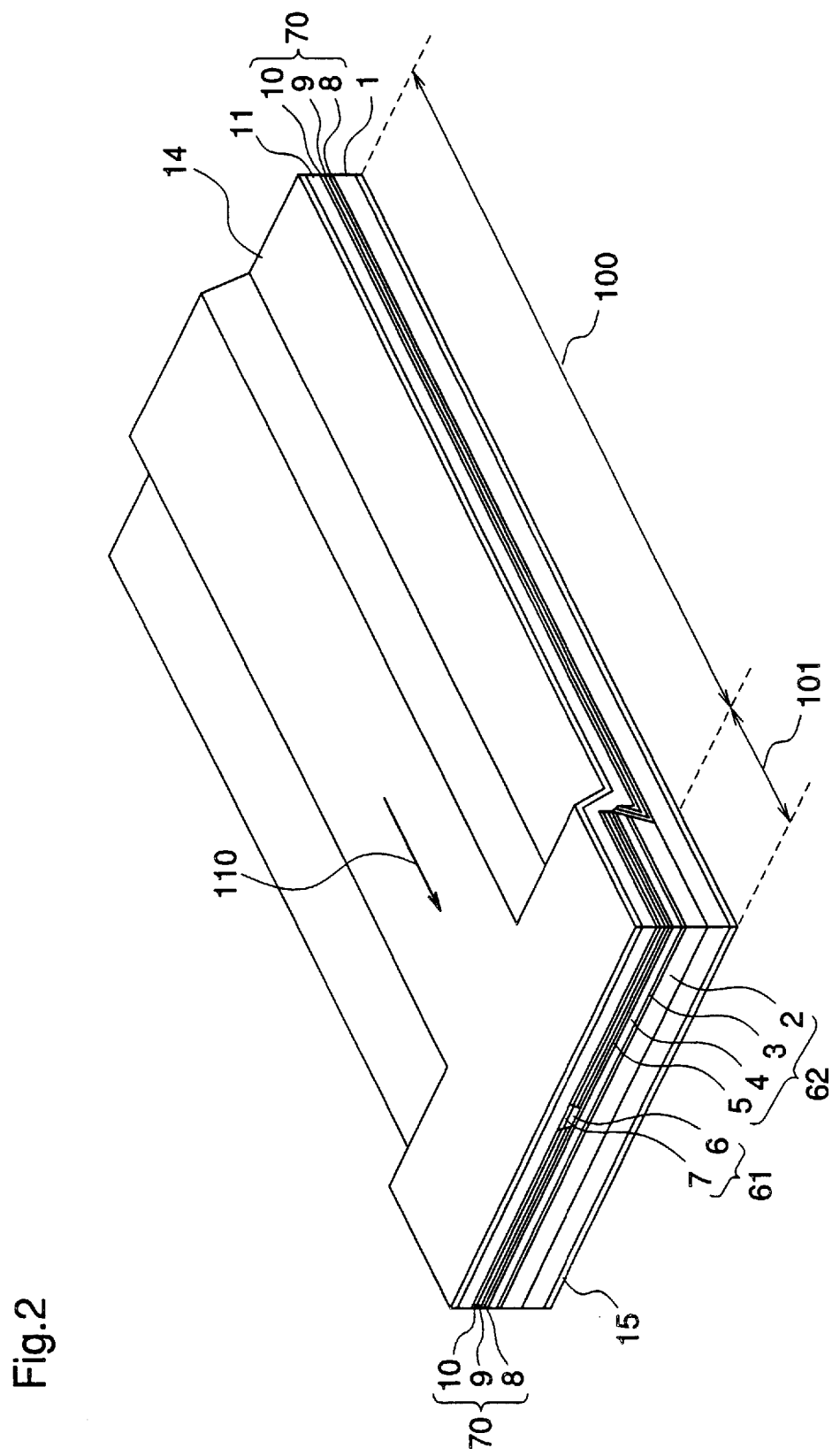
FIG. 2 is a perspective view of the semiconductor laser device shown in FIG. 1.

FIGS. 1 and 2 are a cross-sectional view and a perspective view, respectively, illustrating an AlGaAs series semiconductor laser device with a waveguide lens in accordance with a first embodiment of the present invention. In FIG. 2, reference numeral 100 designates a waveguide light emitting region, numeral 101 designates a waveguide lens region, and numeral 110 designates a waveguide longitudinal direction. The cross-sectional view shown in FIG. 1 is taken in the waveguide light emitting region 100 and perpendicular to the waveguide longitudinal direction 110.

In the waveguide light emitting region 100, there are successively disposed on an n type GaAs substrate 1, a 2.0 $\mu$m thick n type $Al_xGa_{1-x}As$ (x=0.48) lower cladding layer 2, a 0.1 $\mu$m thick multiquantum well active layer 3 comprising, alternatingly laminated, undoped $Al_xGa_{1-x}As$ (x=0.10) well layers and undoped $Al_xGa_{1-x}As$ (x=0.35) barrier layers, a 0.3 $\mu$m thick p type $Al_xGa_{1-x}As$ (x=0.48) first upper cladding layer 4, and a 0.02 μm thick p type $Al_xGa_{1-x}As$ (x=0.70) etch stopping layer 5. These layers 2, 3, 4, and 5 form a lower part 62 of a double heterojunction structure 63. Further, a 1.1 μm thick p type $Al_xGa_{1-x}As$ (x=0.48) second upper cladding layer 6 and a 0.7 μm thick p type GaAs cap layer 7 are disposed on a central portion of the lower part 62 of the double heterojunction structure 63, opposite a current injection region 105. The upper cladding layer 6 and the cap layer 7 form a mesa structure 61, i.e., an upper part of the double heterojunction structure 63. In the double heterojunction structure 63 comprising the lower part 62 and the upper part (mesa structure) 61, a portion of the active layer 3 opposite the upper part 61 and the vicinity serve as a waveguide.

Further, n type GaAs current blocking layers 8, p type GaAs current blocking layers 9, and n type GaAs current blocking layers 10 are disposed on the surface of the lower part 62 of the double heterojunction structure 63 at both sides of the mesa structure 61 and on the surface of the substrate 1 at both sides of the lower part 62, whereby the double heterojunction structure 63 is buried in the current blocking layers 8, 9, 10. These layers 8, 9, and 10 provide current blocking and light confinement structures 70 at both sides of the double heterojunction structure 63. Furthermore, a p type GaAs contact layer 11 is disposed on the upper part 61 of the double heterojunction structure 63 and on the current blocking structures 70. A p side electrode 14 comprising Ti(50 nm)/Pt(50 nm)/Au(200 nm) is disposed on the surface of the contact layer 11, and an n side electrode 15 comprising AuGe(50 nm)/Ni(20 nm)/Au(200 nm) is disposed on the rear surface of the substrate 1.

In the waveguide lens region 101, although the upper part 61 of the double heterojunction structure 63 is identical to that in the waveguide light emitting region 100, the lower part 62 of the double heterojunction structure 63 is wider than that in the waveguide light emitting region 100. The lower cladding layer 2, the active layer 3, the first upper cladding layer 4, the etch stopping layer 5, the second upper cladding layer 5, and the cap layer 7 are thinner in the waveguide lens region 101 than in the waveguide light emitting region 100.

FIGS. 3(a)–3(f) are a perspective view (3(a)) and cross-sectional views (3(b)–3(f)) illustrating process steps in a method of fabricating the AlGaAs series semiconductor laser device with a waveguide lens according to the first embodiment of the present invention. The cross-sectional views are taken in the waveguide light emitting region 100 and perpendicular to the waveguide longitudinal direction 110.

Figure 3:
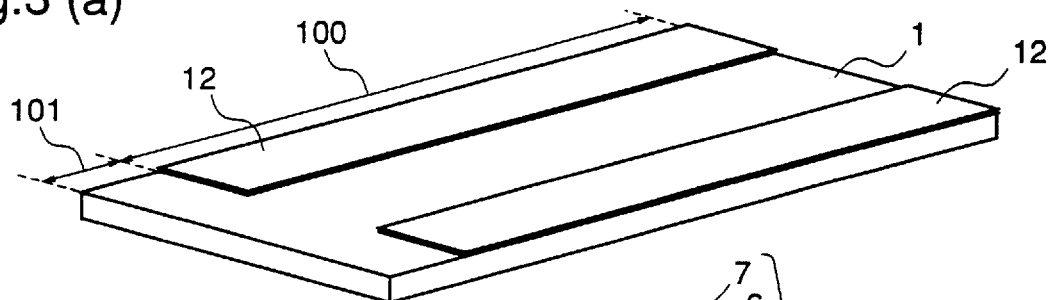
FIG. 3(a) is a perspective view and FIGS. 3(b)–3(f) are cross-sectional views, illustrating process steps in a method of fabricating the semiconductor laser device shown in FIGS. 1 and 2.
Figure 3:
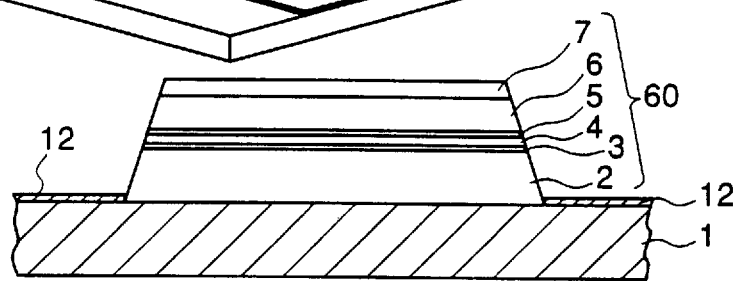
Figure 3:
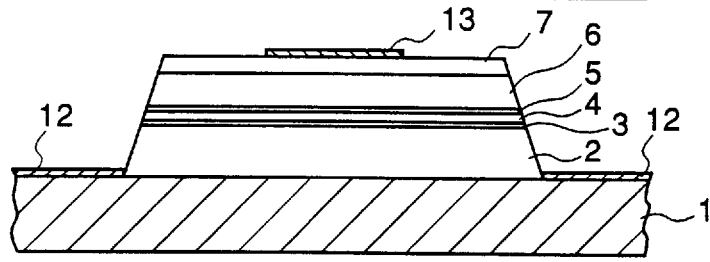
Figure 3:
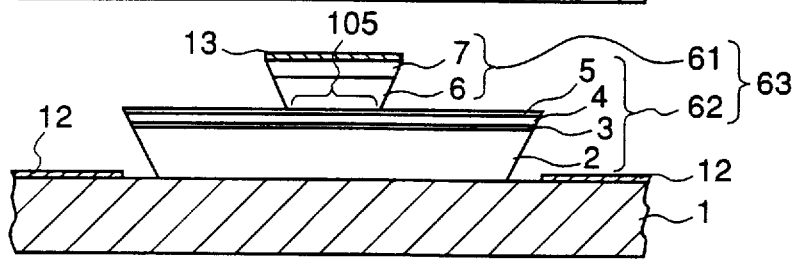
Figure 3:
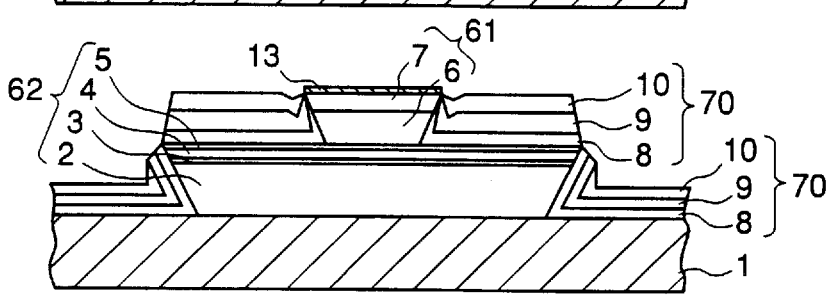
Figure 3:
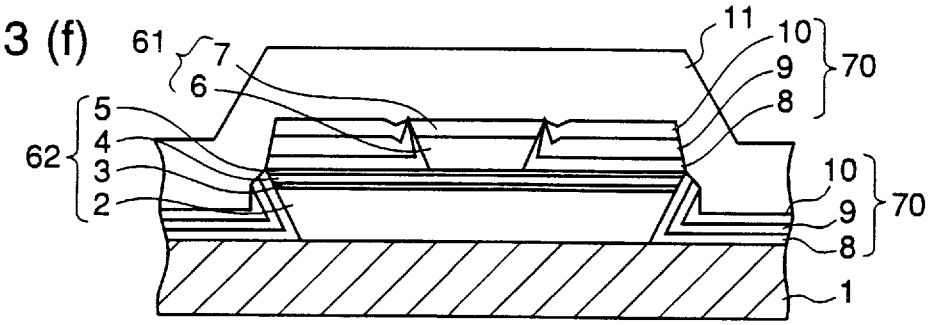

Initially, as illustrated in FIG. 3(a), a pair of thin dielectric films 12 comprising $SiO_2$ or the like and each having a width of 10~20 μm are formed on an n type GaAs substrate 1, sandwiching a waveguide light emitting region 100. Thereafter, as illustrated in FIG. 3(b), using the dielectric films 12 as masks, there are successively grown on the substrate 1, a 2.0 μm thick n type $Al_xGa_{1-x}As$ (x=0.48) lower cladding layer 2, a 0.1 μm thick multiquantum well active layer 3 comprising, alternatingly laminated, undoped $Al_xGa_{1-x}As$ (x=0.10) well layers and undoped $Al_xGa_{1-x}As$ (x=0.35) barrier layers, a 0.3 μm thick p type $Al_xGa_{1-x}As$ (x=0.48) first upper cladding layer 4, a 0.02 μm thick p type $Al_xGa_{1-x}As$ (x=0.70) etch stopping layer 5, a 1.1 μm thick p type $Al_xGa_{1-x}As$ (x=0.48) second upper cladding layer 6, and a 0.7 μm thick p type GaAs cap layer 7, whereby a double heterojunction structure 60 is fabricated. Preferably, these layers are grown by MOCVD. Since the double heterojunction structure 60 is grown using the thin dielectric films 12 as masks, this double heterojunction structure 60 is thicker in the waveguide light emitting region 100 than in the waveguide lens region 101.

In the step of FIG. 3(c), a stripe-shaped dielectric film 13 comprising $SiO_2$ or the like and having a width of 3~10 μm is formed on a central portion of the p type GaAs cap layer 7 opposite a current injection region 105.

Thereafter, as illustrated in FIG. 3(d), using the dielectric film 13 as a mask, the p type GaAs cap layer 7 and the p type $Al_xGa_{1-x}As$ (x=0.48) second upper cladding layer 6 are etched until the surface of the etch stopping layer 5 is exposed. An etchant that selectively etches AlGaAs having an Al composition x smaller than 0.7, for example, a mixture of tartaric acid and hydrogen peroxide, is used thereby producing a mesa structure 61 (an upper part of the double heterojunction structure) opposite the current injection region 105. As a result, a double heterojunction structure 63 comprising a lower part 62 that comprises the lower cladding layer 2, the active layer 3, the first upper cladding layer 4, and the etch stopping layer 5, and an upper part 61 that comprises the second upper cladding layer 6 and the cap layer 7, is obtained.

In the step of FIG. 3(e), after removal of the masks 12, n type GaAs current blocking layers 8, p type GaAs current blocking layers 9, and n type GaAs current blocking layers 10 are successively grown on the surface of the lower part 62 of the double heterojunction structure 63 at both sides of the mesa structure 61 and on the surface of the substrate 1 at both sides of the lower part 62, preferably by MOCVD, whereby the double heterojunction structure 63 is buried in a current blocking and light confinement structure 70 comprising these layers 8, 9, and 10.

In the step of FIG. 3(f), the mask 13 is removed, and a p type GaAs contact layer 11 is grown over the entire surface, preferably by MOCVD. Finally, a p side electrode 14 comprising Ti(50 nm)/Pt(50 nm)/Au(200 nm) is produced on the surface of the contact layer 11, and an n side electrode 15 comprising AuGe(50 nm)/Ni(20 nm)/Au(200 nm) is produced on the rear surface of the substrate 1 to complete an AlGaAs series semiconductor laser device with a waveguide lens according to the first embodiment of the invention.

A description is given of the operation of the semiconductor laser device. When a forward bias voltage is applied across the p side electrode 14 and the n side electrode 15, electrons and holes are injected into the active layer 3 and recombine to produce light. When the current flowing between the electrodes exceeds a threshold current level, laser oscillation occurs. Laser light produced in the active layer 3 in the waveguide light emitting region 100 travels toward the waveguide lens region 101. Since the thicknesses of the respective layers in the double heterojunction structure 63 are thinner in the waveguide lens region 101 than in the waveguide light emitting region 100, the spot size of the laser light sufficiently increases in the waveguide lens region 101 adjacent to the front facet of the laser. Therefore, after the laser light is emitted from the front facet, the spot size of the laser light hardly increases, and the laser light travels straight in the air.

In the semiconductor laser device according to the first embodiment of the present invention, in regions at both sides of the lower part 62 of the double heterojunction structure 63, the n type GaAs current blocking layer 8, the p type GaAs current blocking layer 9, and the n type GaAs current blocking layer 10 are disposed between the n type GaAs substrate 1 and the p type GaAs contact layer 11. Therefore, even when a forward bias voltage is applied across the p side electrode 14 and the n side electrode 15, a reverse bias voltage is applied across the p type GaAs current blocking layer 9 and the n type GaAs current blocking layer 10, so that no reactive current flows from the contact layer 11 through the current blocking layers 8, 9, and 10 to the substrate 1, whereby the efficiency of the laser is improved.

[Embodiment 2]

Figure 4:
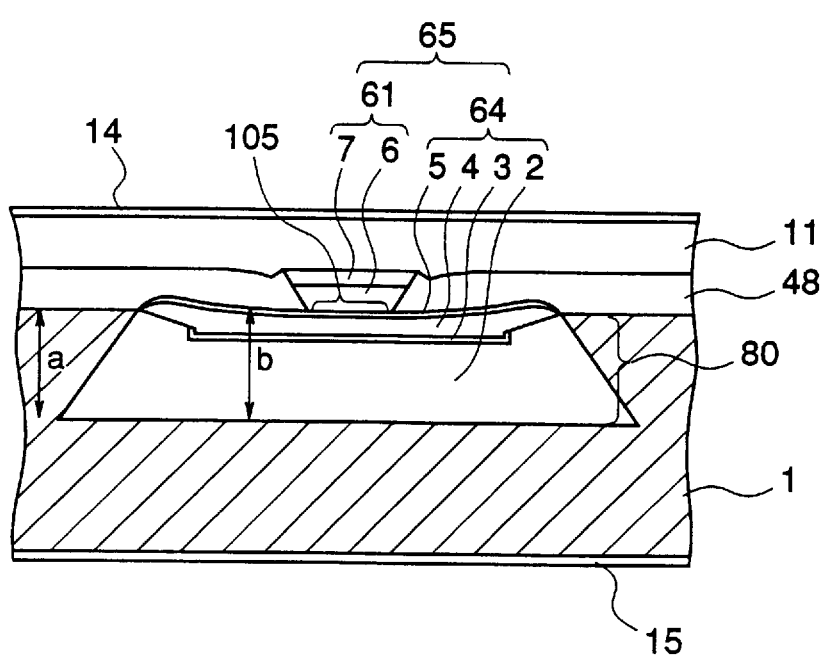
FIG. 4 is a cross-sectional view illustrating a semiconductor laser device with a waveguide lens in accordance with a second embodiment of the present invention.
Figure 5:
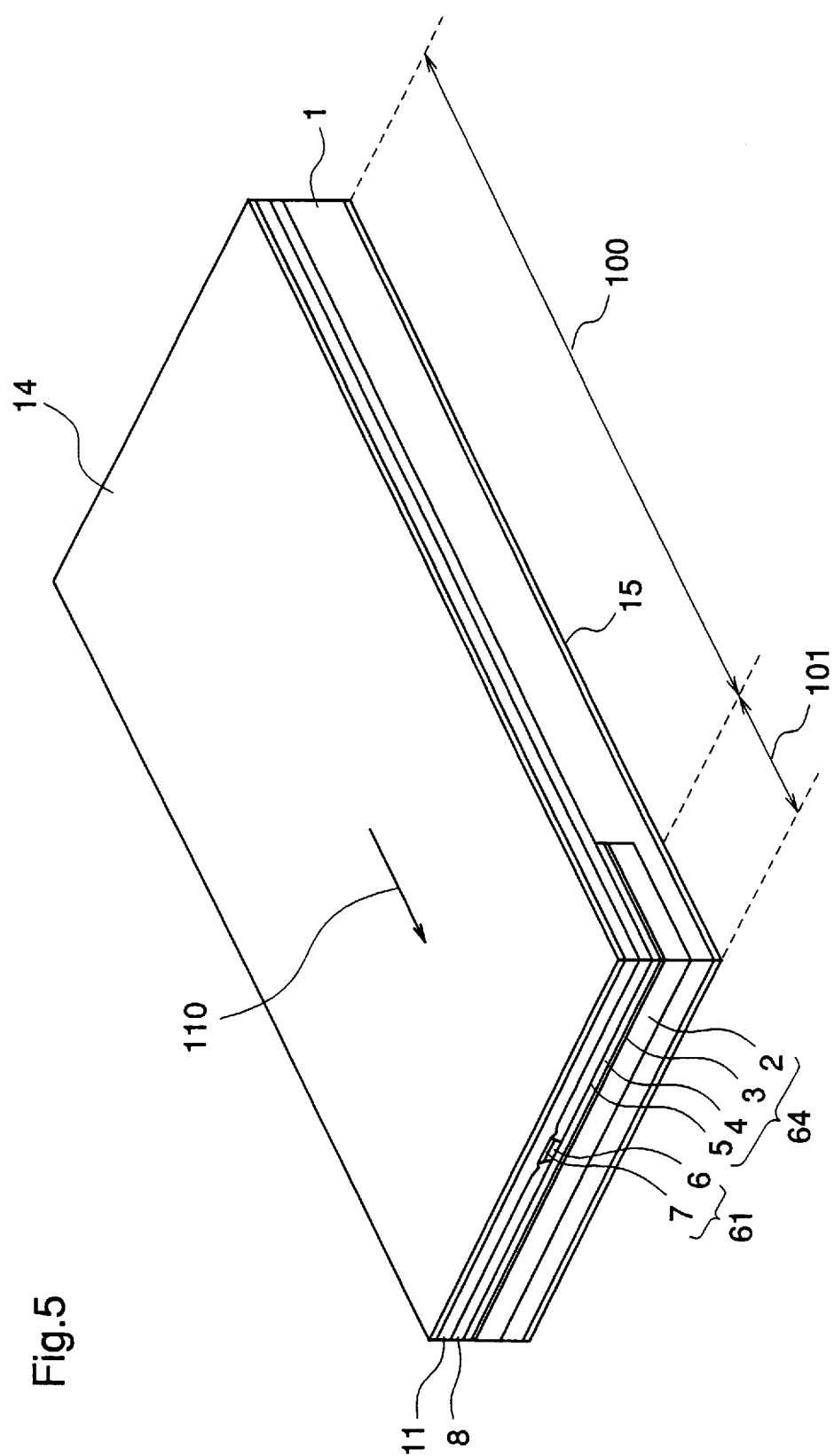
FIG. 5 is a perspective view of the semiconductor laser device shown in FIG. 4.

FIGS. 4 and 5 are a cross-sectional view and a perspective view, respectively, illustrating a semiconductor laser device with a waveguide lens in accordance with a second embodiment of the present invention. In these figures the same reference numerals as those shown in FIGS. 1 and 2 designate the same or corresponding parts. The cross-sectional view shown in FIG. 4 is taken in the waveguide light emitting region 100 and perpendicular to the waveguide longitudinal direction 110.

In the waveguide light emitting region 100, as shown in FIG. 4, an n type GaAs substrate 1 has a groove 80 at the surface, and the groove 80 is filled with an n type $Al_{0.48}Ga_{0.52}As$ lower cladding layer 2, a multiquantum well active layer 3, a p type $Al_{0.48}Ga_{0.52}As$ first upper cladding layer 4, and a p type $Al_{0.7}Ga_{0.3}As$ etch stopping layer 5. Further, a mesa structure 61 comprising a p type $Al_{0.48}Ga_{0.52}As$ second upper cladding layer 6 and a p type GaAs cap layer 7 is disposed on the etch stopping layer 5 opposite a current injection region 105. In this second embodiment, a double heterojunction structure 65 comprises a lower part 64 that comprises the lower cladding layer 2, the active layer 3, the upper cladding layer 4, and the etch stopping layer 5, which layers are disposed in the groove 80, and an upper part (the mesa structure) 61 that comprises the upper cladding layer 6 and the cap layer 7. N type current blocking layers 48 are disposed on both sides of the mesa structure 61 and on the surface of the substrate 1 outside the groove 8. In the double heterojunction structure 65, a portion of the active layer 3 opposite the mesa structure 61 and its vicinity serve as a waveguide. A p type GaAs contact layer 11 is disposed on the mesa structure 61 and on the current blocking layers 48. A p side electrode 14 is disposed on the contact layer 11, and an n side electrode 15 is disposed on the rear surface of the substrate 1.

In the waveguide lens region 101, although the upper part 61 of the double heterojunction structure 65 is identical to that in the waveguide light emitting region 100, the lower part 64 of the double heterojunction structure 65 is wider than that in the waveguide light emitting region 100. The lower cladding layer 2, the active layer 3, the first upper cladding layer 4, the etch stopping layer 5, the second upper cladding layer 6, and the cap layer 7 are thinner in the waveguide lens region 101 than in the waveguide light emitting region 100.

In the laser device according to this second embodiment of the invention, the depth a of the groove 80 and the thickness b of the lower part 64 of the double heterojunction structure have a relationship, $0 \leq a \leq b$, whereby the surface of the laser device is made planar.

FIGS. 6(a)–6(f) are a perspective view (6(a)) and cross-sectional views (6(b)–6(f)) illustrating process steps in a method of fabricating an AlGaAs series semiconductor laser device with a waveguide lens according to the second embodiment of the present invention. In these figures, the same reference numerals as those shown in FIGS. 3(a)–3(f) designate the same or corresponding parts.

Initially, as illustrated in FIG. 6(a), a pair of thin dielectric films 12 comprising $SiO_2$ or the like and each having a width of 10~20 μm are formed on an n type GaAs substrate 1, sandwiching a waveguide light emitting region 100. Thereafter, as illustrated in FIG. 6(b), using the dielectric films 12 as masks, the substrate 1 is etched to form a groove 80. The depth of the groove 80 is represented by a.

In the step of FIG. 6(c), using the dielectric films 12 as masks, there are successively grown on the bottom of the groove 80, an n type $Al_xGa_{1-x}As$ (x=0.48) lower cladding layer 2, a multiquantum well active layer 3 comprising, alternatingly laminated, undoped $Al_xGa_{1-x}As$ (x=0.10) well layers and undoped $Al_xGa_{1-x}As$ (x=0.35) barrier layers, a p type $Al_xGa_{1-x}As$ (x=0.48) first upper cladding layer 4, a p type $Al_xGa_{1-x}As$ (x=0.70) etch stopping layer 5, a p type $Al_xGa_{1-x}As$ (x=0.48) second upper cladding layer 6, and a p type GaAs cap layer 7, thereby producing a double heterojunction structure 60. Preferably, these layers are grown by MOCVD. The MOCVD growth is controlled so that the depth a of the groove 80 and the total thickness b of the lower cladding layer 2, the active layer 3, the first upper cladding layer 4, and the etch stopping layer 5 have a relationship, $0 \leq a \leq b$.

In the step of FIG. 6(d), a stripe-shaped dielectric film 13 comprising $SiO_2$ or the like and having a width of 3~10 μm is formed on a central portion of the p type GaAs cap layer 7 opposite a current injection region 105. Thereafter, using the dielectric film 13 as a mask, the p type GaAs cap layer 7 and the p type $Al_xGa_{1-x}As$ (x=0.48) second upper cladding layer 6 are etched until the surface of the p type $Al_xGa_{1-x}As$ (x=0.70) etch stopping layer 5 is exposed. An etchant that selectively etches AlGaAs having an Al composition x smaller than 0.7, for example, a mixture of tartaric acid and hydrogen peroxide, is used, thereby producing a mesa structure 61 (an upper part of the double heterojunction structure) opposite the current injection region 105. Thereafter, the masks 12 are removed.

In the step of FIG. 6(e), n type GaAs current blocking layers 48 are grown on both sides of the mesa structure 61, preferably by MOCVD. Thereafter, as illustrated in FIG. 6(f), the mask 13 is removed, and a p type GaAs contact layer 11 is grown over the entire surface of the structure, preferably by MOCVD. Finally, a p side electrode 14 comprising Ti(50 nm)/Pt(50 nm)/Au(200 nm) is produced on the surface of the contact layer 11, and an n side electrode 15 comprising AuGe(50 nm)/Ni(20 nm)/Au(200 nm) is produced on the rear surface of the substrate 1 to complete an AlGaAs series semiconductor laser device with a waveguide lens according to the second embodiment of the invention.

In the AlGaAs series semiconductor laser device with a waveguide lens according to the second embodiment of the present invention, the lower part 64 of the double heterojunction structure 65 having a thickness b is buried in the groove 80 having a depth a from the surface of the substrate 1, and the depth a and the thickness b satisfy a relationship, $0 \leq a \leq b$, and the upper part 61 of the double heterojunction structure 65, i.e., the mesa structure on the lower part 64, is buried with the current blocking layers 48. Therefore, the surface of the laser device can be made planar.

In the method of fabricating an AlGaAs series semiconductor laser device with a waveguide lens according to the second embodiment of the invention, after the double heterojunction structure 60 is grown in the groove 80 having a depth a from the surface of the substrate 1, the cap layer 7 and the second upper cladding layer 6 are etched, except portions in the current injection region 105, to form the upper part 61 of the double heterojunction structure, leaving the lower cladding layer 2, the active layer 3, the first upper cladding layer 4, and the etch stopping layer 5 in the groove 80 as the lower part 64 of the double heterojunction structure having a thickness b. The etching of the groove 80 and the growth of the semiconductor layers in the lower part 64 of the double heterojunction structure are performed so that a relationship, $0 \leq a \leq b$, stands. Further, the current blocking layers 48 are grown on both sides of the upper part 61 of the double heterojunction structure. Therefore, a semiconductor laser device with a planar surface is produced in a relatively simple process.

[Embodiment 3]

Figure 7:
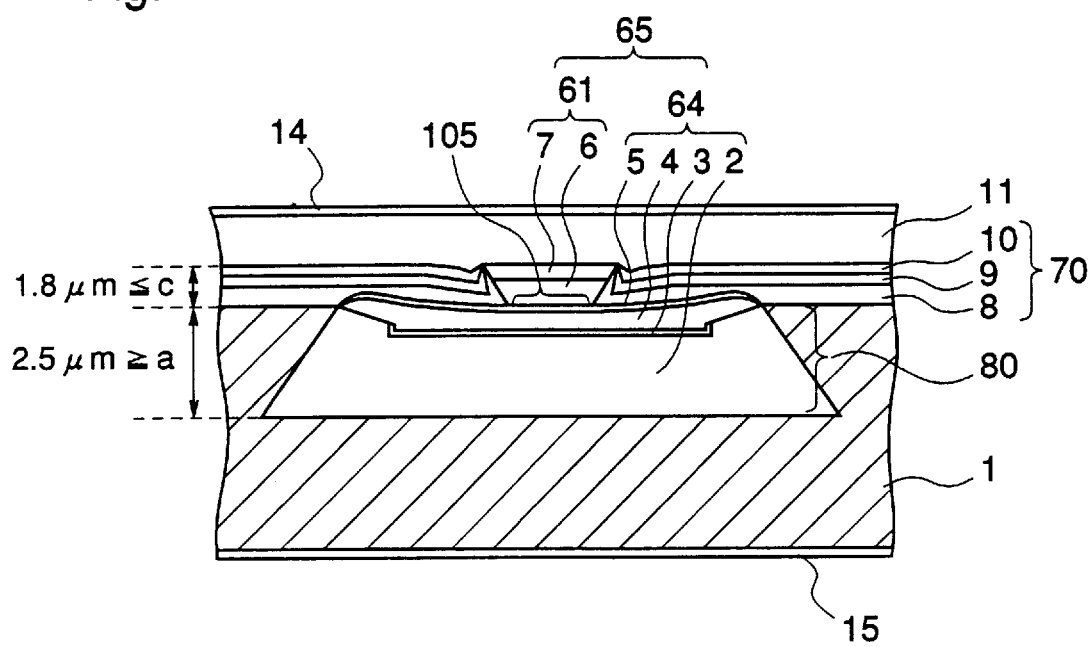
FIG. 7 is a cross-sectional view illustrating a semiconductor laser device with a waveguide lens in accordance with a third embodiment of the present invention.
Figure 8:
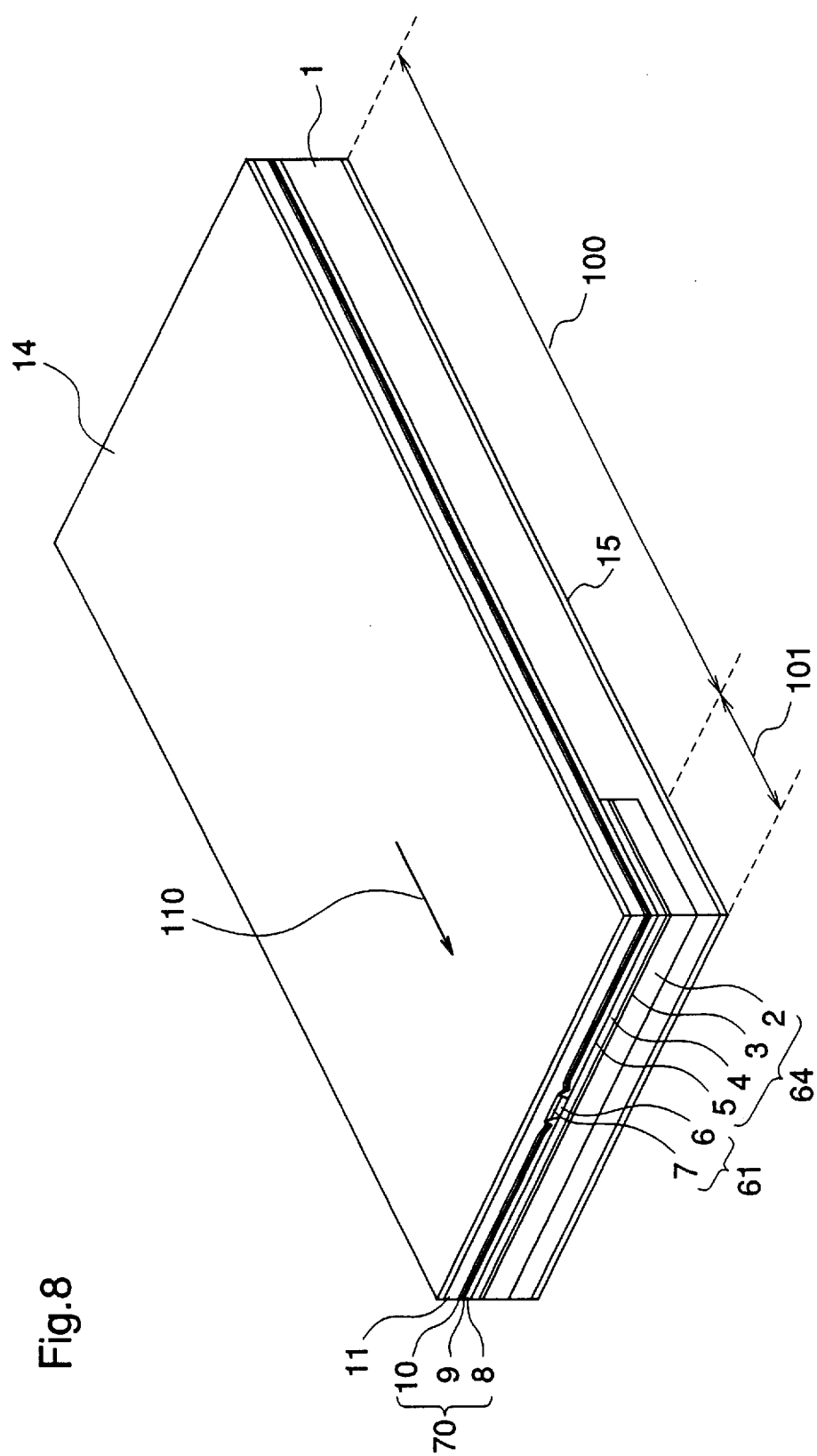
FIG. 8 is a perspective view of the semiconductor laser device shown in FIG. 7.

FIGS. 7 and 8 are a cross-sectional view and a perspective view, respectively, illustrating an AlGaAs semiconductor laser device with a waveguide lens in accordance with a third embodiment of the present invention. In these figures the same reference numerals as those shown in FIGS. 1, 2, 4, and 5 designate the same or corresponding parts. The cross-sectional view shown in FIG. 7 is taken in the waveguide light emitting region 100 and perpendicular to the waveguide longitudinal direction 110.

Also in the semiconductor laser according to this third embodiment, as in the second embodiment, the lower part 64 of the double heterojunction structure 65 is buried in the groove 80 at the surface of the substrate 1, and the upper part of the double heterojunction structure, i.e., the mesa structure 61, is disposed on the lower part 64 opposite the current injection region 105. However, the current blocking structure at both sides of the mesa structure 61 according to this third embodiment is different from the current blocking layer 48 according to the second embodiment. That is, in this third embodiment, the current blocking structure comprises three layers, i.e., an n type GaAs current blocking layer 8, a p type GaAs current blocking layer 9, and an n type GaAs current blocking layer 10. Further, the depth a of the groove 80 from the surface of the substrate 1 is smaller than about 2.5 μm, that is, the total thickness of the 2.0 μm thick lower cladding layer 2, the 0.1 μm thick active layer 3, the 0.3 μm thick first upper cladding layer 4, and the 0.02 μm thick etch stopping layer 5, i.e., the thickness of the lower part 64 of the double heterojunction structure. The total thickness c of the current blocking layers 8, 9, and 10 is larger than about 1.8 μm, that is, the total thickness of the 1.1 μm thick second upper cladding layer 6 and the 0.7 μm thick cap layer 7, i.e., the thickness of the upper part 61 of the double heterojunction structure. Also in this third embodiment, in the double heterojunction structure 65 comprising the upper part 61 and the lower part 64, a portion of the active layer 3 opposite the upper part 61 and its vicinity serve as a waveguide.

FIGS. 9(a)–9(f) are a perspective view (FIG. 9(a)) and cross-sectional views (FIG. 9(b)–9(f)) illustrating process steps in a method of fabricating an AlGaAs series semiconductor laser device with a waveguide lens according to the third embodiment of the present invention.

The process steps of producing a double heterojunction structure shown in FIGS. 9(a)–9(d) are identical to the process steps already described with respect to FIGS. 6(a)–6(d) except the depth a of the groove 80 shown in FIG. 9(b). In this third embodiment, the depth a is smaller than about 2.5 μm, that is, the total thickness of the 2.0 μm thick lower cladding layer 2, the 0.1 μm thick active layer 3, the 0.3 μm thick first upper cladding layer 4, and the 0.02 μm thick etch stopping layer 5, which layers constitute the lower part 64 of the double heterojunction structure.

After formation of the double heterojunction structure 60, as illustrated in FIG. 9(d), the p type GaAs cap layer 7 and the p type AlGaAs second upper cladding layer 6 are etched, except portions opposite the current injection region 105, to form a mesa structure 61, i.e., an upper part of the double heterojunction structure. After removal of the masks 12, as illustrated in FIG. 9(e), an n type GaAs current blocking layer 8, a p type GaAs current blocking layer 9, and an n type GaAs current blocking layer 10 are successively grown on both sides of the mesa structure 61 to bury the mesa structure 61, thereby producing a current blocking and light confinement structure 70. The current blocking layers 8, 9, and 10 are grown so that the total thickness c of these layers is smaller than 1.8 μm, that is, the total thickness of the 1.1 μm second upper cladding layer 6 and the 0.7 μm thick cap layer 7.

Thereafter, a p type GaAs contact layer 11 is grown over the entire surface (FIG. 9(f)), and a p side electrode 14 and an n side electrode 15 are produced to complete the laser device.

In this third embodiment of the present invention, the depth a of the groove 80 at the surface of the n type GaAs substrate 1 is smaller than about 2.5 μm, that is, the thickness of the lower part 64 of the double heterojunction structure 65, and the thickness c of the current blocking structure 70 comprising the current blocking layers 8, 9, and 10 is larger than 1.8 μm, that is, the thickness of the upper part 61 of the double heterojunction structure 65, whereby the surface of the semiconductor laser device is made planar. Further, in regions at both sides of the lower part 64 of the double heterojunction structure 65, the n type GaAs current blocking layer 8, the p type GaAs current blocking layer 9, and the n type GaAs current blocking layer 10 are disposed between the n type GaAs substrate 1 and the p type GaAs contact layer 11. Therefore, even when a forward bias voltage is applied across the p side electrode 14 and the n side electrode 15, a reverse bias voltage is applied across the p type GaAs current blocking layer 9 and the n type GaAs current blocking layer 10, so that no reactive current flows from the contact layer 11 through the current blocking layers 8, 9, and 10 to the n type GaAs substrate 1, whereby the efficiency of the laser is improved.

[Embodiment 4]

Figure 10:
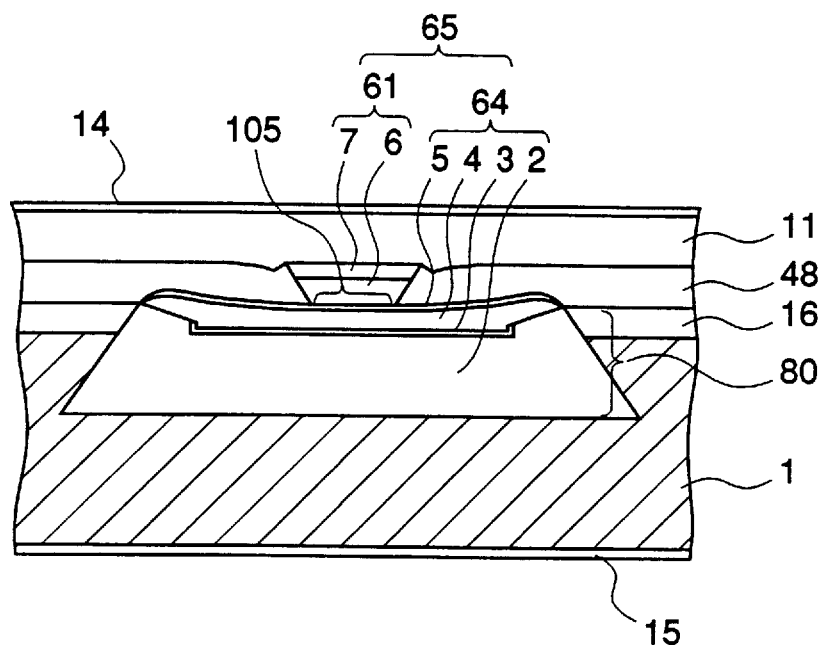
FIG. 10 is a cross-sectional view illustrating a semiconductor laser device with a waveguide lens in accordance with a fourth embodiment of the present invention.
Figure 11:
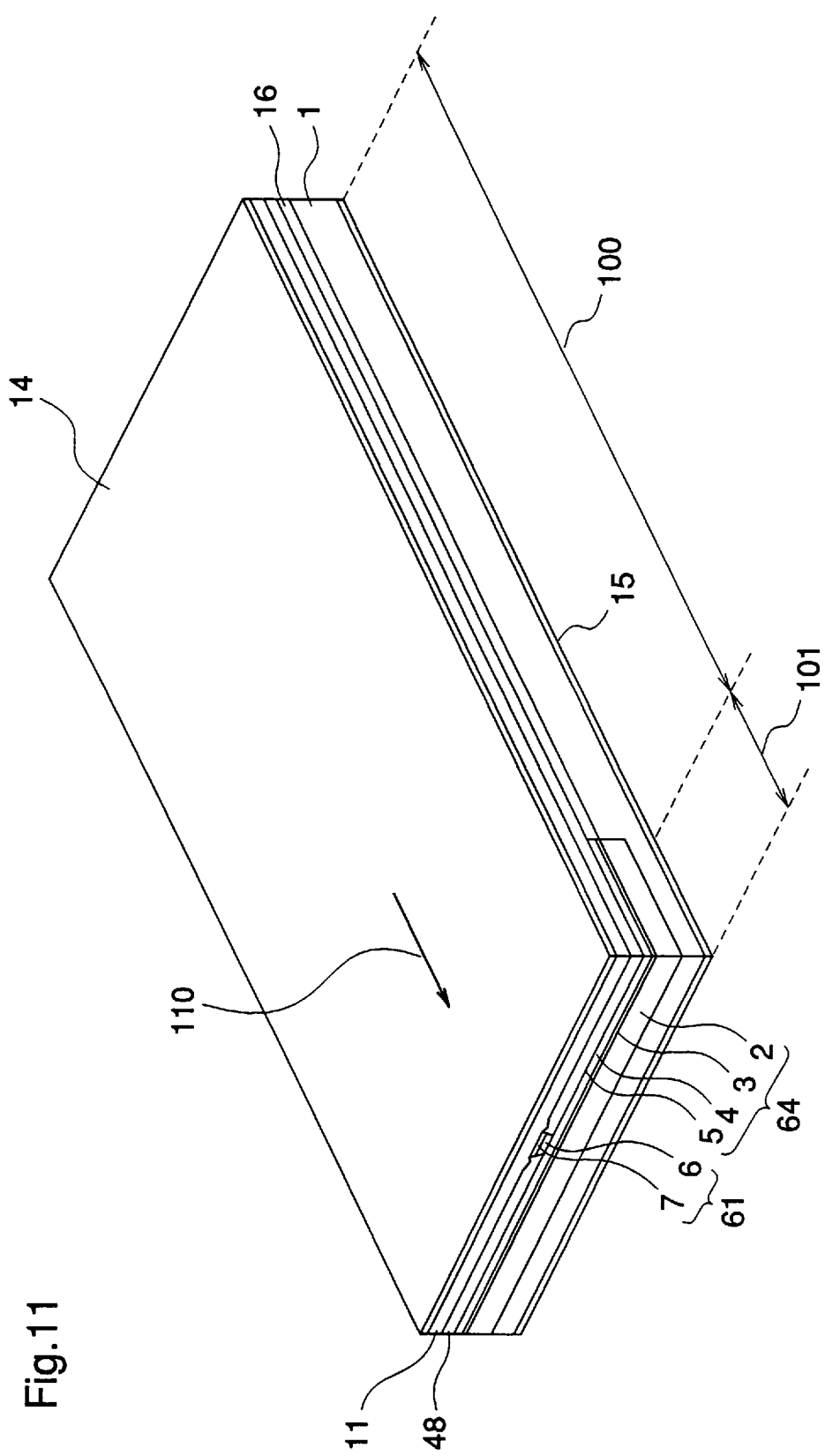
FIG. 11 is a perspective view of the semiconductor laser device shown in FIG. 10.

FIGS. 10 and 11 are a cross-sectional view and a perspective view, respectively, illustrating an AlGaAs series semiconductor laser device with a waveguide lens in accordance with a fourth embodiment of the present invention. In these figures, the same reference numerals as those shown in FIGS. 1, 2, 4, and 5 designate the same or corresponding parts. The cross-sectional view shown in FIG. 10 is taken in the waveguide light emitting region 100 and perpendicular to the waveguide longitudinal direction 101.

The semiconductor laser device according to this fourth embodiment is identical to the semiconductor laser device according to the second embodiment shown in FIGS. 4 and 5 except that a p type GaAs layer 16 is interposed between the n type GaAs current blocking layer 48 and the n type GaAs substrate 1 in regions where the groove 80 is not present.

FIGS. 12(a)–12(g) are perspective views (12(a) and 12(b)) and cross-sectional views (12(c)–12(g)) illustrating process steps in a method of fabricating an AlGaAs series semiconductor laser device with a waveguide lens in accordance with a fourth embodiment of the present invention.

Figure 12:
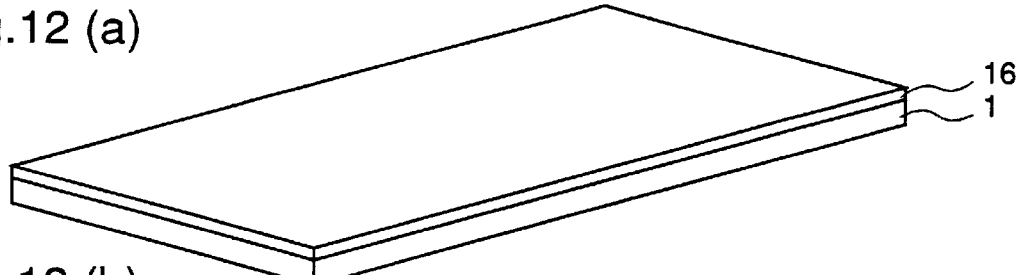
FIGS. 12(a) and 12(b) are perspective views and FIGS. 12(c)–12(g) are cross-sectional views, illustrating process steps in a method of fabricating the semiconductor laser device shown in FIGS. 10 and 11.
Figure 12:
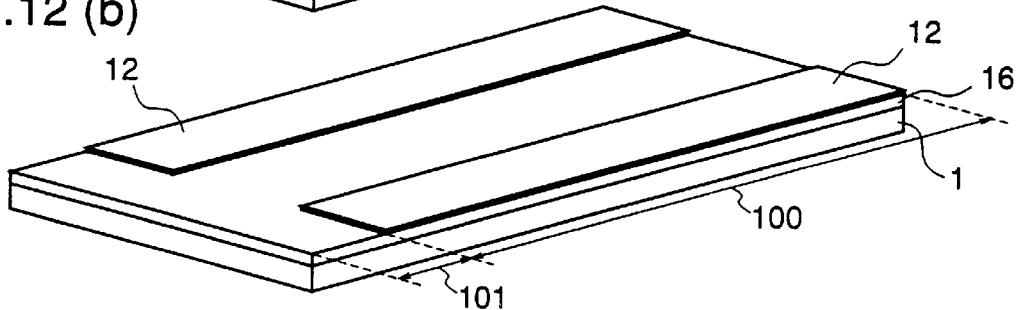
Figure 12:
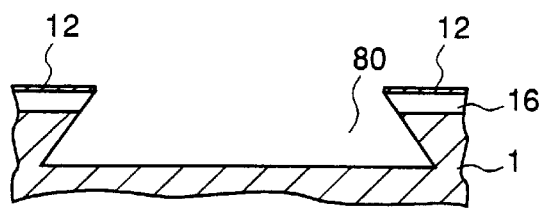
Figure 12:
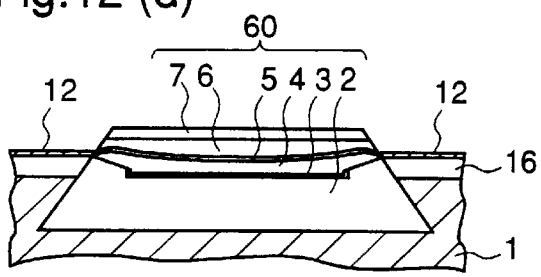
Figure 12:
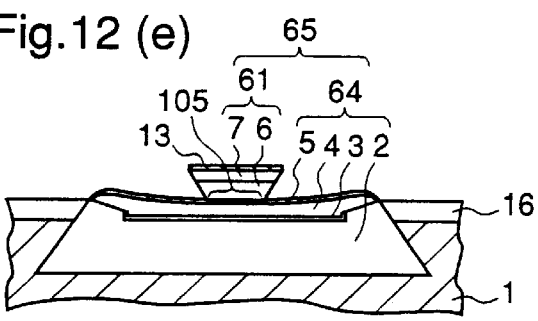
Figure 12:
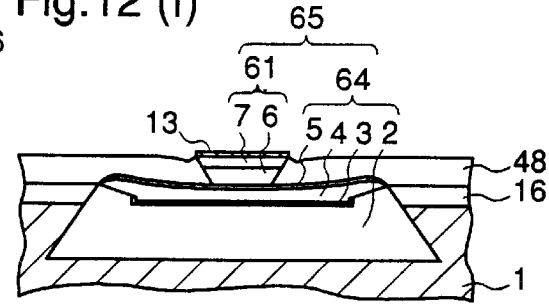
Figure 12:
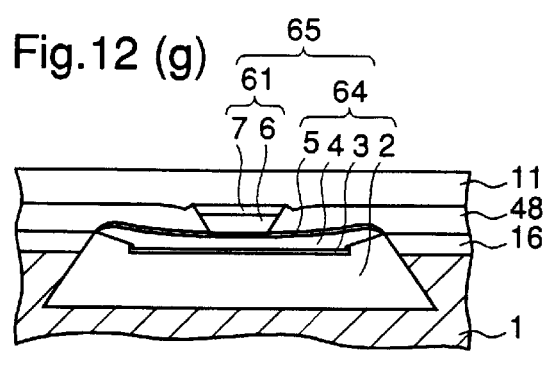

Initially, as illustrated in FIG. 12(a), a p type GaAs layer 16 is grown over the entire surface of the n type GaAs substrate 1, preferably by MOCVD. Thereafter, as illustrated in FIG. 12(b), a pair of thin dielectric films 12 comprising SiO$_2$ or the like and each having a width of 10–20 $\mu$m are formed on the surface of the p type GaAs layer 16, sandwiching a waveguide light emitting region 100.

In the step of FIG. 12(c), using the dielectric films 12 as masks, the p type GaAs layer 16 and the substrate 1 are etched to form a groove 80.

The process steps after the formation of the groove 80, i.e., the step of forming a double heterojunction structure 65 having a lower part 64 buried in the groove 80 (FIGS. 12(d) and 12(e)), the step of forming an n type GaAs current blocking layer 48 on both sides of an upper part 61 of the double heterojunction structure (FIG. 12(f)), and the step of forming a contact layer 11 (FIG. 12(g)) are identical to those already described with respect to FIGS. 6(c)–6(f).

In this fourth embodiment of the present invention, since the lower part 64 of the double heterojunction structure is buried in the groove 80 that is formed by etching the n type GaAs substrate 1 and the p type GaAs layer 16, the planality of the semiconductor laser device is improved. Further, the surface of the n type GaAs substrate 1 outside the groove 80 is coated with the p type GaAs layer 16 having a conductivity type opposite from the conductivity type of the substrate, and the p type GaAs layer 16 and the n type current blocking layer 48 are disposed between the n type GaAs substrate 1 and the p type GaAs contact layer 11 in a region where the groove 80 is not present, so that unwanted reactive current is prevented from flowing between the contact layer 11 and the substrate 1 in this region. Further, since the current blocking layer 48 is a single n type GaAs layer, the structure of the current blocking layer is simplified as compared with the three-layer current blocking structure according to the third embodiment of the invention. Therefore, a high efficiency semiconductor laser device that can prevent unwanted reactive current is fabricated in a relatively simple process.

Although the current blocking layer 48 is a single n type GaAs layer in this fourth embodiment, it may comprise a laminated n type GaAs layer and p type GaAs layer.

[Embodiment 5]

FIGS. 13(a)–13(f) are perspective views (13(a) and 13(b)) and cross-sectional views (13(c)–13(f)) illustrating process steps in a method of fabricating an AlGaAs series semiconductor laser device with a waveguide lens in accordance with a fifth embodiment of the present invention. In the figures, the same reference numerals as those shown in FIGS. 12(a)–12(g) designate the same or corresponding parts.

Figure 13:
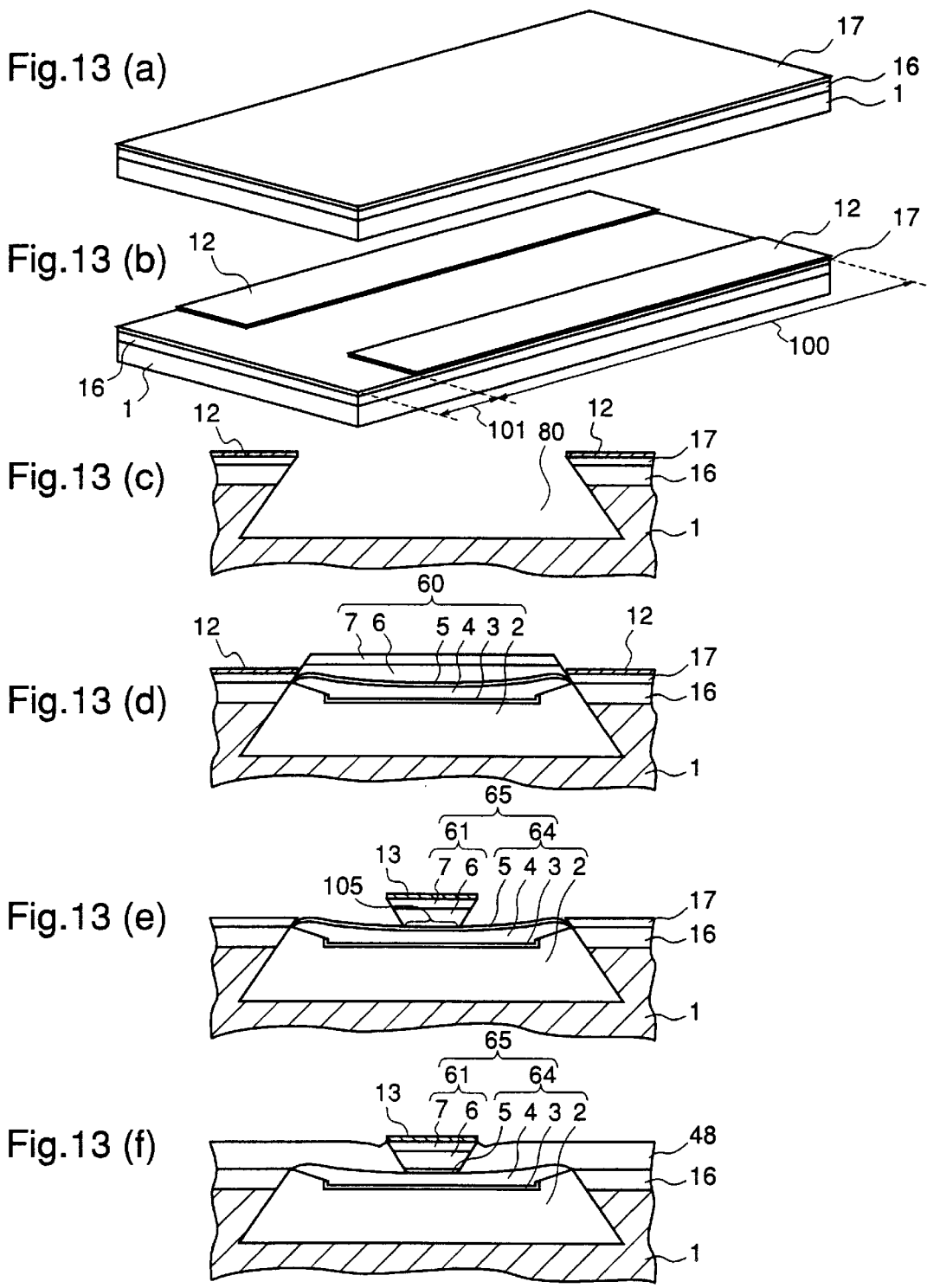
FIGS. 13(a) and 13(b) are perspective views and FIGS. 13(c)–13(g) are cross-sectional views, illustrating process steps in a method of fabricating a semiconductor laser device with a waveguide lens in accordance with a fifth embodiment of the present invention.

Initially, as illustrated in FIG. 13(a), a p type GaAs layer 16 and a p type Al$_{0.7}$Ga$_{0.3}$As protective film 17 are grown on the surface of the n type GaAs substrate 1, preferably by MOCVD. Thereafter, as illustrated in FIG. 13(b), a pair of thin dielectric films 12 comprising SiO$_2$ or the like and each having a width of 10–20 $\mu$m are formed on the surface of the protective film 17, sandwiching a waveguide light emitting region 100. Further, as illustrated in FIG. 13(c), using the dielectric films 12 as masks, the p type Al$_{0.7}$Ga$_{0.3}$As protective film 17, the p type GaAs layer 16, and the substrate 1 are etched to form a groove 80.

In the step of FIG. 13(d), an n type Al$_{0.48}$Ga$_{0.52}$As lower cladding layer 2, a multiquantum well active layer 3, a p type Al$_{0.48}$Ga$_{0.52}$As first upper cladding layer 4, a p type Al$_{0.7}$Ga$_{0.3}$As etch stopping layer 5, a p type Al$_{0.48}$Ga$_{0.52}$As second upper cladding layer 6, and a p type GaAs cap layer 7 are successively grown in the groove 80, preferably by MOCVD, to form a double heterojunction structure 60, followed by removal of the dielectric films 12.

In the step of FIG. 13(e), a stripe-shaped thin dielectric film 13 comprising SiO$_2$ or the like and having a thickness of 3~10 $\mu$m is formed on the p type GaAs cap layer 7 opposite a current injection region 105. Using the dielectric film 13 as a mask, the p type GaAs contact layer 7 and the p type Al$_{0.48}$Ga$_{0.52}$As second upper cladding layer 6 are etched until the surface of the p type Al$_{0.7}$Ga$_{0.3}$As etch stopping layer 5 is exposed. An etchant that selectively etches AlGaAs having an Al composition ratio x smaller than 0.7, for example, a mixture of tartaric acid and hydrogen peroxide, is used, thereby forming a mesa structure 61 (an upper part of the double heterojunction structure) opposite the current injection region 105. Since the surface of the substrate 1 outside the groove 80 is covered with the p type Al$_{0.7}$Ga$_{0.3}$As protective film 17, this region is not etched.

In the step of FIG. 13(f), portions of the etch stopping layer 5 in regions where the protective film 17 and the mesa structure 61 are not present are etched and removed, and an n type GaAs current blocking layer 48 is grown on the first upper cladding layer 4 and on the p type GaAs layer 16, contacting both sides of the mesa structure 61. Thereafter, the dielectric film 13 is removed, and a p type GaAs contact layer 11 is grown over the entire surface. Finally, a p side electrode 14 and an n side electrode 15 are produced to complete a semiconductor laser device having a structure similar to the structure shown in FIGS. 10 and 11.

In the method of fabricating a semiconductor laser device according to this fifth embodiment of the invention, since the p type GaAs layer 16 is covered with the Al$_{0.7}$Ga$_{0.3}$As protective film 17 which is not etched when the mesa structure 61 is formed by etching, it is possible to remove the dielectric films 12, which serve as masks when both the groove 80 is formed by etching and the double heterojunction structure 60 is grown, immediately after the growth of the double heterojunction structure 60. Therefore, it is not necessary to remove only the dielectric films 12 without removing the dielectric film 13 after the formation of the mesa structure 61, as shown in FIG. 12(e), according to the fourth embodiment. More specifically, in the fourth embodiment of the invention, after the etching process to form the mesa structure 61, the dielectric film 13 is masked with a resist (not shown), and only the dielectric films 12 are etched and removed, followed by removal of the resist. However, in this fifth embodiment of the invention, immediately after the growth of the double heterojunction structure 60, only the dielectric films 12 can be etched and removed without masking a specific region of the structure, so that the fabrication process is simplified. Further, since the dielectric films 12 are formed not on the surface of the p type GaAs layer 16 but on the protective film 17, and the protective film 17 is removed after the growth of the double heterojunction structure 60, the surface of the p type GaAs layer 16 is not damaged when the dielectric films 12 are formed. Therefore, the n type GaAs current blocking layer 48 is grown on the undamaged surface of the p type GaAs layer 16 in regions outside the groove 80, whereby unwanted reactive current is effectively prevented from flowing between the p type GaAs contact layer 11 and the n type GaAs substrate 1.

While in this fifth embodiment the current blocking layer 48 is a single n type GaAs layer, it may comprise a laminated n type GaAs layer and p type GaAs layer.

[Embodiment 6]

Figure 14:
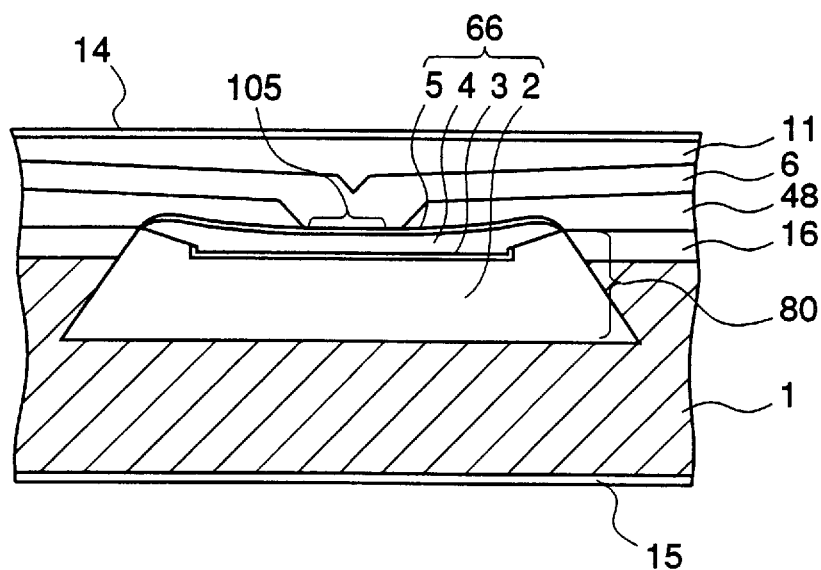
FIG. 14 is a cross-sectional view illustrating a semiconductor laser device having a waveguide lens in accordance with a sixth embodiment of the present invention.
Figure 15:
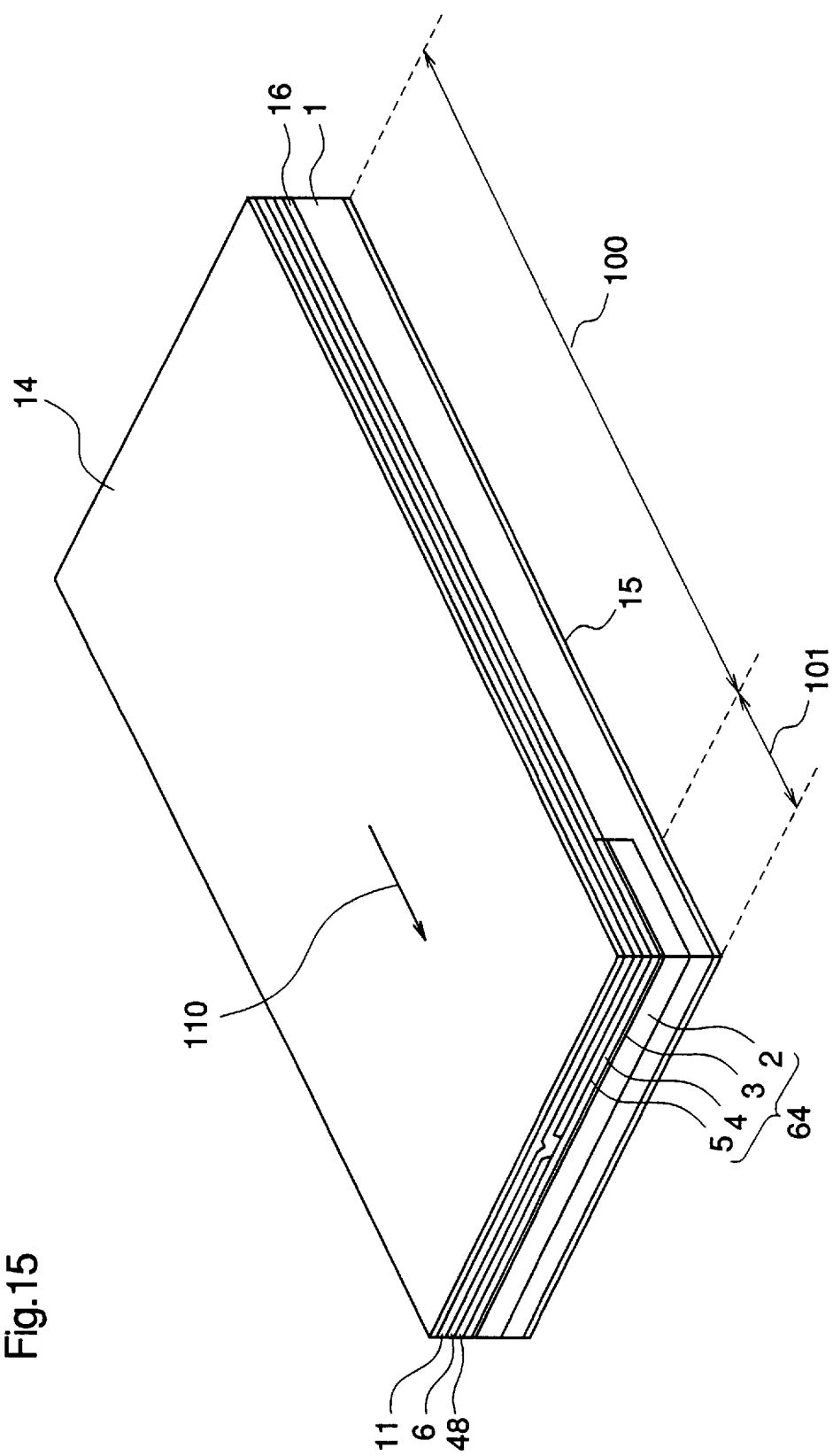
FIG. 15 is a perspective view illustrating the semiconductor laser device shown in FIG. 14.

FIGS. 14 and 15 are a cross-sectional view and a perspective view, respectively, illustrating an AlGaAs series semiconductor laser device with a waveguide lens in accordance with a sixth embodiment of the present invention. The cross-sectional view shown in FIG. 14 is taken in the waveguide light emitting region 100 and perpendicular to the waveguide longitudinal direction 110. In these figures, the same reference numerals as those shown in FIGS. 10 and 11 designate the same or corresponding parts.

In the semiconductor laser device according to this sixth embodiment of the invention, a p type GaAs layer 16 is disposed on the surface of the n type GaAs substrate 1, and a groove 80 is formed by removing portions of the p type GaAs layer 16 and the substrate 1. A double heterojunction structure 66 comprising an n type $Al_{0.48}Ga_{0.52}As$ lower cladding layer 2, a multiquantum well active layer 3, a p type $Al_{0.48}Ga_{0.52}As$ first upper cladding layer 4, and a p type $Al_{0.7}Ga_{0.3}As$ etch stopping layer 5 is buried in the groove 80. N type GaAs current blocking layers 48 are disposed on the double heterojunction structure 66, except a current injection region 105, and on the p type GaAs layer 16. A p type GaAs contact layer 11 is disposed over the entire surface of the second upper cladding layer 6. A p side electrode 14 is disposed on the surface of the contact layer 11, and an n side electrode 15 is disposed on the rear surface of the substrate 1. In the double heterojunction structure 66, a portion of the active layer 3 opposite the current injection region 105 and its vicinity serve as a waveguide.

FIGS. 16(a)–16(i) are perspective views (16(a) and 16(b)) and cross-sectional views (16(c)–16(i)) illustrating process steps in a method of fabricating an AlGaAs series semiconductor laser device with a waveguide lens according to the sixth embodiment of the present invention.

Figure 16:
FIGS. 16(a) and 16(b) are perspective views and FIGS. 16(c)–16(i) are cross-sectional views, illustrating process steps in a method of fabricating the semiconductor laser device shown in FIGS. 14 and 15.
Figure 16:
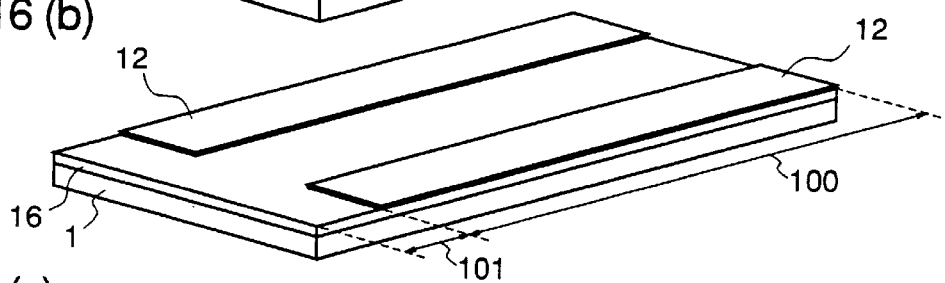
Figure 16:
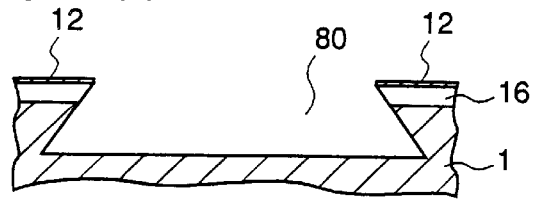
Figure 16:
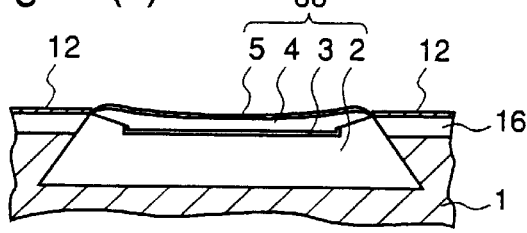
Figure 16:
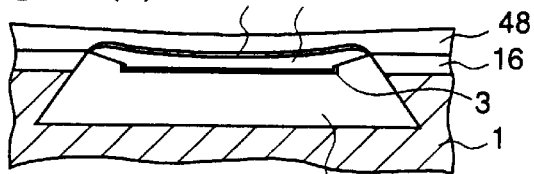
Figure 16:
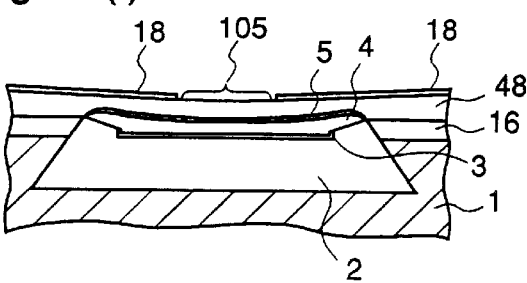
Figure 16:
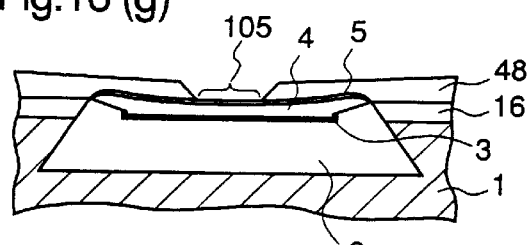
Figure 16:
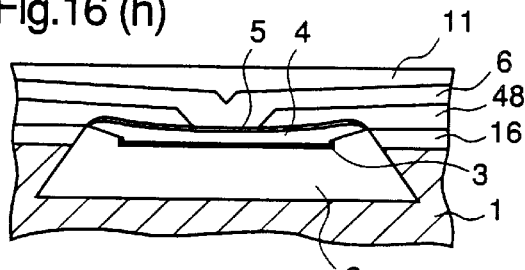
Figure 16:
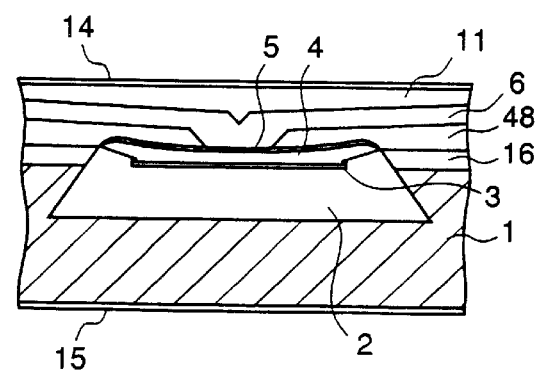
Figure 17:
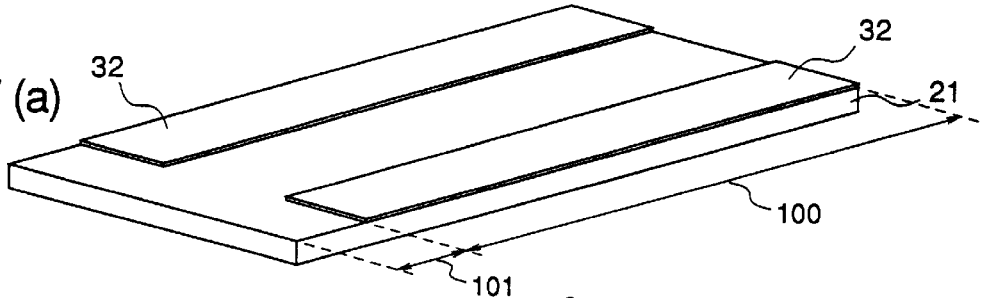
FIGS. 17(a)–17(f) are perspective views illustrating process steps in a method of fabricating an InP series semiconductor laser device with a waveguide lens according to the prior art.
Figure 17:
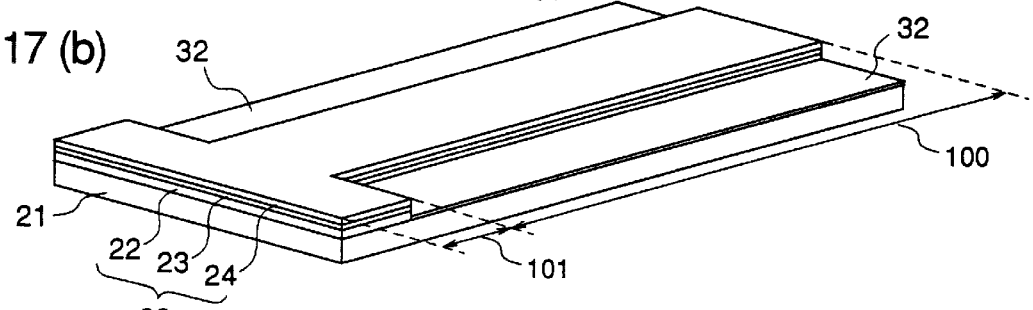
Figure 17:
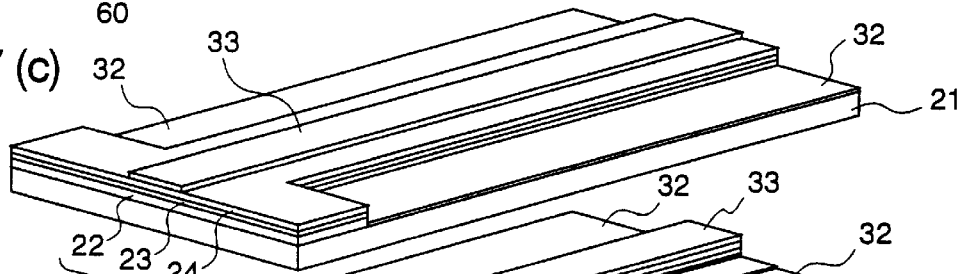
Figure 17:
Figure 17:
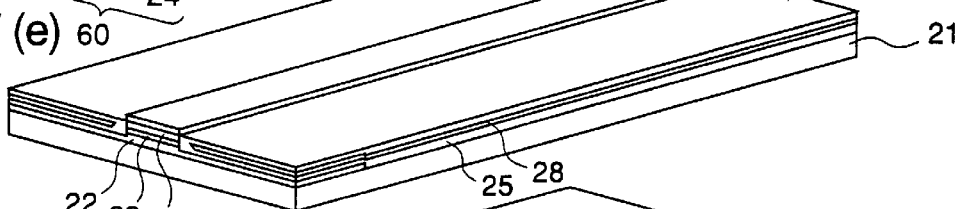
Figure 17:
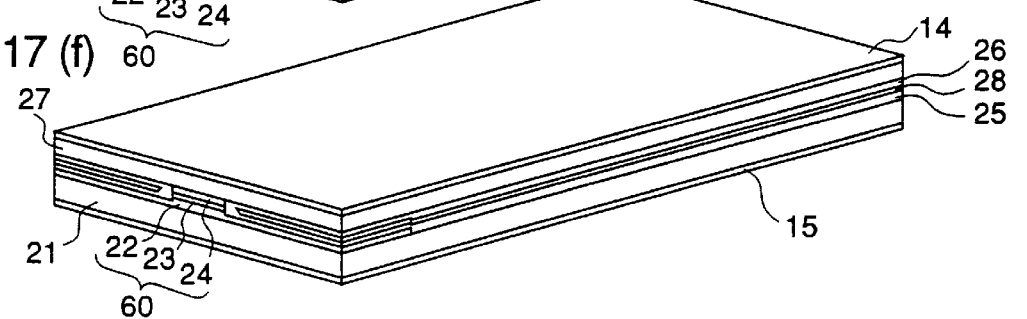
Figure 18:
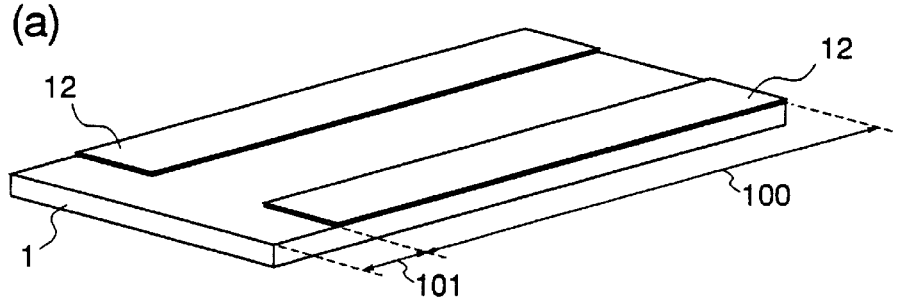
FIG. 18(a) is a perspective view and FIGS. 18(b)–18(g) are cross-sectional views, illustrating process steps in a method of fabricating an AlGaAs series semiconductor laser device with a waveguide lens according to the prior art.
Figure 18:
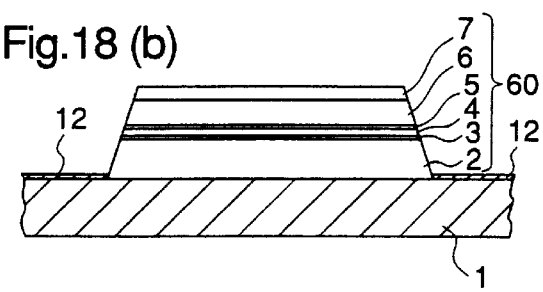
Figure 18:
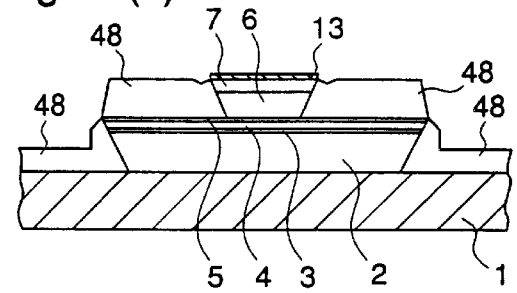
Figure 18:
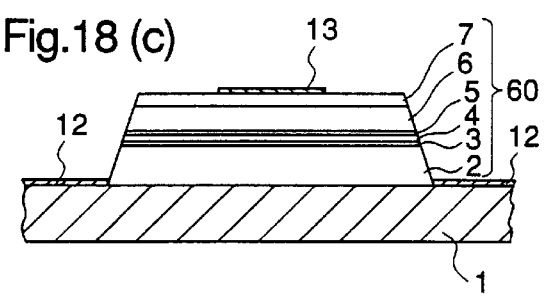
Figure 18:
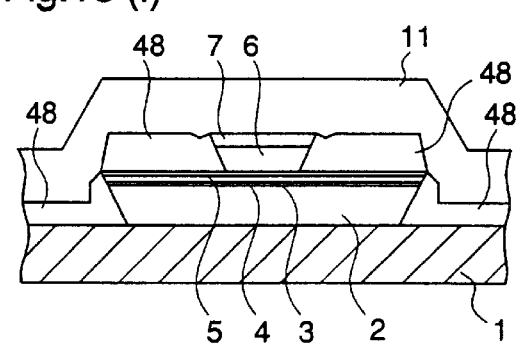
Figure 18:
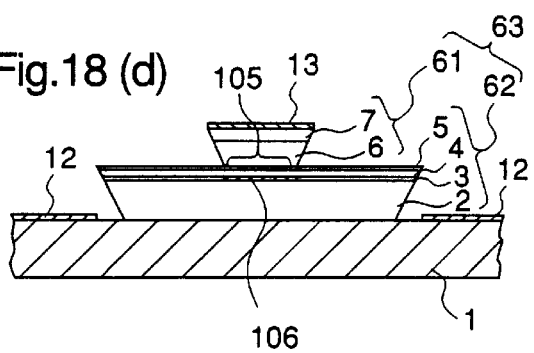
Figure 18:
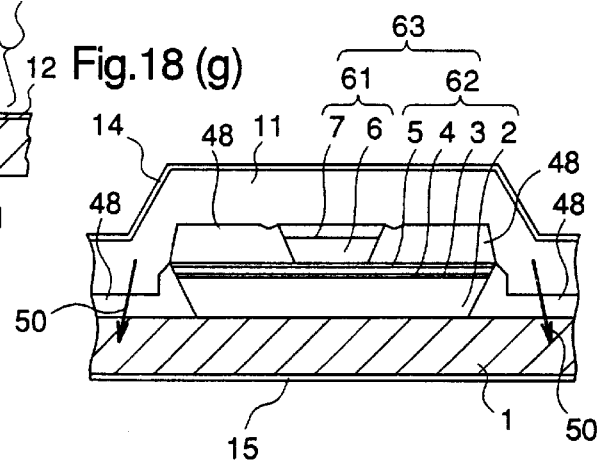

Initially, as illustrated in FIG. 16(a), a p type GaAs layer 16 is grown over the entire surface of the n type GaAs substrate 1, preferably by MOCVD. Thereafter, as illustrated in FIG. 16(b), thin dielectric films 12 comprising $SiO_2$ or the like and each having a width of 10~20 μm are formed on the surface of the p type GaAs layer 16, sandwiching a waveguide light emitting region 100. In the step of FIG. 16(c), using the dielectric films 12 as masks, the p type GaAs layer 16 and the substrate 1 are etched to form a groove 80.

In the step of FIG. 16(d), an n type $Al_{0.48}Ga_{0.52}As$ lower cladding layer 2, a multiquantum well active layer 3, a p type $Al_{0.48}Ga_{0.52}As$ first upper cladding layer 4, and a p type $Al_{0.7}Ga_{0.3}As$ etch stopping layer 5 are successively grown in the groove 80, preferably by MOCVD, thereby producing a double heterojunction structure 66 buried in the groove 80. Thereafter, the dielectric films 12 are removed.

In the step of FIG. 16(e), an n type GaAs current blocking layer 48 is grown over the entire surface of the structure, preferably by MOCVD. Thereafter, as illustrated in FIG. 16(f), thin dielectric films 18 are formed on the current blocking layer 48 except a region opposed to the current injection region 105. Further, using the dielectric films 18 as masks, the n type GaAs current blocking layer 48 is etched until the surface of the p type $Al_{0.7}Ga_{0.3}As$ etch stopping layer 5 is exposed. An etchant that selectively etches AlGaAs having an Al composition ratio x smaller than 0.7, for example, a mixture of tartaric acid and hydrogen peroxide, is used. Thereafter, as illustrated in FIG. 16(g), the dielectric films 18 are removed.

In the step of FIG. 16(h), a p type $Al_{0.48}Ga_{0.52}As$ second upper cladding layer 6 and a p type GaAs contact layer 11 are successively grown over the entire surface, preferably by MOCVD. Finally, as illustrated in FIG. 16(i), a p side electrode 14 and an n side electrode 15 are produced on the surface of the contact layer 11 and the rear surface of the substrate 1, respectively, completing an AlGaAs series semiconductor laser device with a waveguide lens as shown in FIGS. 14 and 15.

According to this sixth embodiment of the invention, since the double heterojunction structure 66 is buried in the groove 80 at the surface of the substrate 1, a semiconductor laser device having a planar surface is obtained. Further, since the surface of the n type GaAs substrate 1 outside the groove 80 is covered with the p type GaAs layer 16, a single n type GaAs layer suffices as a current blocking structure, whereby the current blocking structure is simplified. Therefore, a high efficiency semiconductor laser device preventing unwanted reactive current is fabricated in a relatively simple process.

While in this sixth embodiment the current blocking layer 48 is a single n type GaAs layer, it may comprise a laminated n type GaAs layer and p type GaAs layer.

What is claimed is:

1. A semiconductor laser device comprising:
   a semiconductor substrate of a first conductivity type having a groove at a surface;
   opposed light emitting facets;
   a double heterojunction structure including an optical waveguide that extends between the facets and comprises a light emitting region and a lens region, the lens region being disposed between the light emitting region and one of the facets, and comprising a plurality of AlGaAs series compound semiconductor layers, the double heterojunction structure comprising:
   a lower part comprising a lower cladding layer of the first conductivity type, an active layer, and a first upper cladding layer of a second conductivity type, opposite the first conductivity type, the lower cladding layer, the active layer, and at least part of the first upper cladding layer being disposed within the groove; and
   an upper part narrower than the lower part, located on the lower part, and including a second upper cladding layer of the second conductivity type; and
   a current blocking structure disposed on the lower part of the double heterojunction structure at both sides of the upper part of the double heterojunction structure and on the semiconductor substrate outside the groove and comprising AlGaAs series compound semiconductor materials.

2. The semiconductor laser device of claim 1 wherein:
   the semiconductor substrate comprises an n type semiconductor;
   the lower part of the double heterojunction structure comprises an n type AlGaAs lower cladding layer, an active layer, a p type AlGaAs first upper cladding layer, and a p type AlGaAs etch stopping layer having an Al composition ratio;
   the upper part of the double heterojunction structure is disposed opposite a current injection region of the lower part and comprises a p type AlGaAs second upper cladding layer having an Al composition ratio smaller than the Al composition ratio of the etch stopping layer, and a p type cap layer; and
   the current blocking structure has a thickness and comprises an n type lower layer, a p type intermediate layer, and an n type upper layer.

3. The semiconductor laser device of claim 2 wherein:
   the thickness of the lower part of the double heterojunction structure is 2.5 μm, and the depth of the groove from the surface of the substrate is smaller than 2.5 μm; and the thickness of the upper part of the double heterojunction structure is 1.8 μm, and the thickness of the current blocking structure is larger than 1.8 μm.

4. The semiconductor laser device of claim 1 including a coating layer comprising a semiconductor layer of the second conductivity type and disposed on the surface of the semiconductor substrate where the groove is not present.

5. The semiconductor laser device of claim 4 wherein the current blocking structure comprises a single semiconductor layer of the first conductivity type.

6. A semiconductor laser device comprising:

a semiconductor substrate of a first conductivity type having a surface;

a coating layer comprising a semiconductor material of a second conductivity type, opposite the first conductivity type, disposed on the surface of the substrate, a groove penetrating through the coating layer and into the semiconductor substrate;

opposed light emitting facets;

a double heterojunction structure including an optical waveguide that extends between the facets and comprises a light emitting region and a lens region, the lens region being disposed between the light emitting region and one of the facets, the double heterojunction structure comprising a plurality of AlGaAs series compound semiconductor layers, at least a lower cladding layer of the first conductivity type, an active layer, and a first upper cladding layer of a second conductivity type, the lower cladding layer, the active layer, and at least part of the first upper cladding layer being disposed within the groove;

current blocking layers comprising an AlGaAs series compound semiconductor material and disposed on the double heterojunction structure, except opposite a current injection region, and on the coating layer; and a second upper cladding layer of the second conductivity type disposed on the portion of the double heterojunction structure opposite the current injection region and on the current blocking layers.

7. The semiconductor laser device of claim 1 wherein the lower part of the double heterojunction structure includes a second conductivity type AlGaAs series compound semiconductor etch stopping layer interposed between the first upper cladding layer and the upper part of the double heterojunction structure.

8. The semiconductor laser device of claim 1 wherein the current blocking structure comprises a lower layer of the first conductivity type, an intermediate layer of the second conductivity type, and an upper layer of the first conductivity type.

9. The semiconductor laser device of claim 6 wherein the lower part of the double heterojunction structure includes a second conductivity type AlGaAs series compound semiconductor etch stopping layer interposed between the first upper cladding layer and the upper part of the double heterojunction structure.

10. A semiconductor laser device comprising:

a semiconductor substrate of a first conductivity type having a surface;

a coating layer comprising a semiconductor material of a second conductivity type, opposite the first conductivity type, disposed on the surface of the substrate, a groove penetrating through the coating layer and into the semiconductor substrate;

opposed light emitting facets;

a double heterojunction structure including an optical waveguide that extends between the facets and comprises a light emitting region and a lens region, the lens region being disposed between the light emitting region and one of the facets, the double heterojunction structure comprising a plurality of AlGaAs series compound semiconductor layers, at least a lower cladding layer of the first conductivity type, an active layer, and a first upper cladding layer of a second conductivity type, the lower cladding layer, the active layer, and at least part of the first upper cladding layer being disposed within the groove;

current blocking layers comprising an AlGaAs series compound semiconductor material and disposed on the double heterojunction structure, except opposite a current injection region, and on the coating layer; and a second upper cladding layer of the second conductivity type disposed on the portion of the double heterojunction structure opposite the current injection region.

11. The semiconductor laser device of claim 10 wherein the lower part of the double heterojunction structure includes a second conductivity type AlGaAs series compound semiconductor etch stopping layer interposed between the first upper cladding layer and the upper part of the double heterojunction structure.

* * * * *